(12) United States Patent
Khursheed et al.

(10) Patent No.: US 11,158,479 B2
(45) Date of Patent: Oct. 26, 2021

(54) CATHODE STRUCTURE FOR COLD FIELD ELECTRON EMISSION AND METHOD OF FABRICATING THE SAME

(71) Applicant: National University of Singapore, Singapore (SG)

(72) Inventors: Anjam Khursheed, Singapore (SG); Xiuyuan Shao, Singapore (SG)

(73) Assignee: National University of Singapore, Singapore (SG)

( * ) Notice: Subject to any disclaimer, the term of this patent is extended or adjusted under 35 U.S.C. 154(b) by 63 days.

(21) Appl. No.: 16/613,460

(22) PCT Filed: May 23, 2018

(86) PCT No.: PCT/SG2018/050247
§ 371 (c)(1),
(2) Date: Nov. 14, 2019

(87) PCT Pub. No.: WO2018/217167
PCT Pub. Date: Nov. 29, 2018

(65) Prior Publication Data
US 2021/0159038 A1    May 27, 2021

(30) Foreign Application Priority Data

May 25, 2017    (SG) .......................... 10201704298W

(51) Int. Cl.
*H01J 9/02* (2006.01)
*H01J 1/304* (2006.01)

(52) U.S. Cl.
CPC ............ *H01J 9/025* (2013.01); *H01J 1/3044* (2013.01); *H01J 2201/30415* (2013.01);
(Continued)

(58) Field of Classification Search
CPC .................... H01J 1/30–3048; H01J 1/14–148
See application file for complete search history.

(56) References Cited

U.S. PATENT DOCUMENTS

| | | | |
|---|---|---|---|
| 7,226,663 | B2 | 6/2007 | Jiao et al. |
| 7,888,654 | B2 | 2/2011 | Tessner, II et al. |
| 8,427,039 | B2 | 4/2013 | Legagneux et al. |

FOREIGN PATENT DOCUMENTS

| | | |
|---|---|---|
| CN | 106229245 A | 12/2016 |
| JP | 2006-331997 A | 12/2006 |
| JP | 2010-015966 A | 1/2010 |

OTHER PUBLICATIONS

Joo et al. "Field emission characteristics of electrochemically synthesized nickel nanowires with oxygen plasma post-treatment" 2006, Institute of Physics Publishing, Nanotechnology 17, 3506-3511 (Year: 2006).*

(Continued)

*Primary Examiner* — Mariceli Santiago
(74) *Attorney, Agent, or Firm* — Michael Best & Friedrich LLP

(57) ABSTRACT

A cathode structure for cold field electron emission and method of fabricating a single-tip cathode structure for cold field electron emission. The cathode structure comprises a pointed cathode wire; and a graphene-based coating on at least a tip of the pointed cathode wire. In a preferred embodiment, graphene is coated on nickel tips by chemical vapour deposition wherein nickel functions as a catalyst for growth of graphene. The cathode structure provides stable cold field emission for electron microscopy and lithography applications and exhibits an ultralow work function value of about 1.1 eV.

16 Claims, 12 Drawing Sheets

(52) U.S. Cl.
CPC ........... *H01J 2201/30426* (2013.01); *H01J 2201/30449* (2013.01); *H01J 2201/30453* (2013.01); *H01J 2201/30496* (2013.01)

(56) References Cited

OTHER PUBLICATIONS

Vila et al. "Growth and Field-Emission Properties of Vertically Aligned Cobalt Nanowire Arrays" 2004, American Chemical Society, Nano Letters 2004 vol. 4, No. 3, 521-524 (Year: 2004).*
Yu et al. "Improved field emission properties of CuO nanowire arrays by coating of graphene oxide layers" American Vacuum Society, Journal of Vacuum Science & Technology B 34(2), Mar./Apr. 2016, 02G102/1-02G102/4 (Year: 2016).*
Samantara et al. "Facile synthesis of Ag nanowire-rGO composites and their promising field emission performance" Royal Society of Chemistry, RSC Advances, 2015, 5, 41887-41893 (Year: 2015).*
Koh et al. "Low Temperature Direct of Graphene onto Metal Nano-Spindt Tip with Applications in Electron Emission" Advance Materials Interfaces 2014, 1, 1300147(1-6) (Year: 2014).*
Maiti et al. "Ultra-thin graphene edges at the nanowire tips: a cascade cold cathode with two-stage field amplification" IOP Publishing, Nanotechnology 22, 2011, 505703, 1-8 (Year: 2011).*
International Search Report and Written Opinion for Application No. PCT/SG2018/050247 dated Aug. 27, 2018 (14 pages).
Shao et al., "A few-layer graphene ring-cathode field emitter for focused electron/ion beam applications," Carbon, 2016, 110:378-383.
Shao et al., "A high-brightness large-diameter graphene coated point cathode field emission electron source," Nature Communications, 2018, 9(1288):1-8.
Tsai et al., "Field Emission from an Individual Freestanding Graphene Edge," Small, 2012, 8(24):3739-3745.
L. Swanson, G. Schwind, A review of the cold-field electron cathode, Advances in Imaging and Electron Physics 159 (2009) 63-100.
G. Giovannetti, P. Khomyakov, G. Brocks, V.v. Karpan, J. Van den Brink, P. Kelly, Doping graphene with metal contacts, Physical Review Letters 101(2) (2008) 026803.
L. W. Swanson and G. A. Schwind, Review of ZrO/W Schottky Cathode, chapter 1, Handbook of Charged Particle Optics, 2nd ed. J. Orloff, CRC Press (2009).
A.K. Geim, K.S. Novoselov, The rise of graphene, Nature materials 6(3) (2007) 183-191.
Angel T. T. Koh, Yuan Mei Foong , Zamri Yusop , Masaki Tanemura , and Daniel H. C. Chua, "Low Temperature Direct of Graphene onto Metal Nano-Spindt Tip with Applications in Electron Emission," Advanced Materials Interfaces, 2014, 1(5):1300147.
Tinghsun Chang,Fangwei Lu,Srinivasu Kunuku,Kehchyang Leou, Nyanhwa Tai and Inan Lin, "Enhanced electron field emission properties from hybrid nanostructures of graphene/Si tip array," RSC Advances, 2015, 5, 2928-2933.
Agrawal et al., "High-Performance Stable Field Emission with Ultralow Turn on Voltage from rGO Conformal Coated TiO2 Nanotubes 3D Arrays," Scientific Reports, 2015, 5(1):1-12.
Chae SJ, et al. Synthesis of large-area graphene layers on poly-nickel substrate by chemical vapor deposition: wrinkle formation. Advanced Materials 21, 2328-2333 (2009).
Baskin Y, Meyer L. Lattice constants of graphite at low temperatures. Physical Review 100, 544 (1955).
Fowler RH, Nordheim L. Electron emission in intense electric fields. Proceedings of the Royal Society of London A 119, 173-181 (1926).
Schwind G, Magera G, Swanson L. Comparison of parameters for Schottky and cold field emission sources. Journal of Vacuum Science & Technology B: Microelectronics and Nanometer Structures Processing, Measurement, and Phenomena 24, 2897-2901 (2006).

Yu Y-J, Zhao Y, Ryu S, Brus LE, Kim KS, Kim P. Tuning the graphene work function by electric field effect. Nano letters 9, 3430-3434 (2009).
Yuan H, et al. Engineering ultra-low work function of graphene. Nano Letters 15, 6475-6480 (2015).
Bronsgeest M, Barth J, Swanson L, Kruit P. Probe current, probe size, and the practical brightness for probe forming systems. Journal of Vacuum Science & Technology B: Microelectronics and Nanometer Structures Processing, Measurement, and Phenomena 26, 949-955 (2008).
Swanson L, Martin N. Field electron cathode stability studies: Zirconium/tungsten thermal-field cathode. Journal of Applied Physics 46, 2029-2050 (1975).
Ye D, Moussa S, Ferguson JD, Baski AA, El-Shall MS. Highly efficient electron field emission from graphene oxide sheets supported by nickel nanotip arrays. Nano letters 12, 1265-1268 (2012).
Lv S, Li Z, Liao J, Wang G, Li M, Miao W. Optimizing field emission properties of the hybrid structures of graphene stretched on patterned and size-controllable SiNWs. Scientific reports 5, 15035 (2015).
Yang Z, Zhao Q, Ou Y, Wang W, Li H, Yu D. Enhanced field emission from large scale uniform monolayer graphene supported by well-aligned ZnO nanowire arrays. Applied Physics Letters 101, 173107 (2012).
Jiang L, et al. Controlled synthesis of large-scale, uniform, vertically standing graphene for high-performance field emitters. Advanced Materials 25, 250-255 (2013).
Eda G, Emrah Unalan H, Rupesinghe N, Amaratunga GA, Chhowalla M. Field emission from graphene based composite thin films. Applied Physics Letters 93, 233502 (2008).
Yamamoto, S., Fukuhara, S., Saito, N. & Okano, H. Stabilization of field emission current. Surf. Sci. 61, 535-549 (1976).
de Jonge, N., Allioux, M., Oostveen, J. T., Teo, K. B. & Milne, W. I. Low noise and stable emission from carbon nanotube electron sources. Appl. Phys. Lett. 87, 133118 (2005).
Tuggle, D., Swanson, L. & Orloff, J. Application of a thermal field emission source for high resolution, high current e-beam microprobes. J. Vac. Sci. Technol. 16, 1699-1703 (1979).
Young, R. D. Theoretical total-energy distribution of field-emitted electrons. Physical Review 113, 110 (1959).
Bahm, A., Schwind, G. & Swanson, L. Range of validity of field emission equations. Journal of Vacuum Science & Technology B: Microelectronics and Nanometer Structures Processing, Measurement, and Phenomena 26, 2080-2084 (2008).
Crewe A, Eggenberger D, Wall J, Welter L. Electron gun using a field emission source. Review of Scientific Instruments 39, 576-583 (1968).
De Jonge N, Lamy Y, Schoots K, Oosterkamp TH. High brightness electron beam from a multi-walled carbon nanotube. Nature 420, 393-395 (2002).
Zhang H, et al. An ultrabright and monochromatic electron point source made of a LaB6 nanowire. Nature nanotechnology 11, 273-279 (2016).
Houdellier F, et al. Development of TEM and SEM high brightness electron guns using cold-field emission from a carbon nanotip. Ultramicroscopy 151, 107-115 (2015).
Houdellier F, Masseboeuf A, Monthioux M, Hytch MJ. New carbon cone nanotip for use in a highly coherent cold field emission electron microscope. Carbon 50, 2037-2044 (2012).
Yeong K, Thong J. Field-emission properties of ultrathin 5 nm tungsten nanowire. Journal of applied physics 100, 114325 (2006).
Jin C, Wang J, Wang M, Su J, Peng L-M. In-situ studies of electron field emission of single carbon nanotubes inside the TEM. Carbon 43, 1026-1031 (2005).
Novoselov KS, et al. Two-dimensional gas of massless Dirac fermions in graphene, nature 438, 197-200 (2005).
Balandin AA, et al. Superior thermal conductivity of single-layer graphene. Nano letters 8, 902-907 (2008).
Reina A, et al. Large area, few-layer graphene films on arbitrary substrates by chemical vapor deposition. Nano letters 9, 30-35 (2008).

(56) References Cited

OTHER PUBLICATIONS

Leong WS, Gong H, Thong JT. Low-contact-resistance graphene devices with nickeletched-graphene contacts. ACS nano 8, 994-1001 (2013).
Kleint C. Electron emission noise. Surface Science 200, 472-489 (1988).
de Jonge, N., Allioux, M., Oostveen, J. T., Teo, K. B. & Milne, W. I. Optical performance of carbon-nanotube electron sources. Phys. Rev. Lett. 94, 186807 (2005).
Ferrari, A. C. & Basko, D. M. Raman spectroscopy as a versatile tool for studying the properties of graphene. Nat. Nanotechnol. 8, 235-246 (2013).
Graf, D. et al. Spatially resolved Raman spectroscopy of single- and few-layer graphene. Nano. Lett. 7, 238 (2006).
Blake, P. et al. Graphene-based liquid crystal device.Nano Lett. 8, 1704-1708 (2008).
Cook, B., Verduin, T., Hagen, C. & Kruit, P. Brightness limitations of cold field emitters caused by Coulomb interactions. Journal of Vacuum Science & Technology B, Nanotechnology and Microelectronics: Materials, Processing, Measurement, and Phenomena 28, C6C74-C76C79 (2010).

\* cited by examiner

CATHODE STRUCTURE FOR COLD FIELD ELECTRON EMISSION AND METHOD OF FABRICATING THE SAME

CROSS REFERENCE TO RELATED APPLICATIONS

This application is a national stage filing under 35 U.S.C. 0.371 of International Patent Application No.: PCT/SG2018/050247, filed May 23, 2018, which claims priority to Singapore Patent Application No. 10201704298W, filed May 25, 2017, the entire contents of all of which are hereby incorporated by reference herein.

FIELD OF INVENTION

The present invention relates broadly to a cathode structure for cold field electron emission and method of fabricating the same, and specifically to cold field emission electron beam sources, the kind used in electron microscopes and electron beam lithography systems. The shape of the cathode used in these types of electron sources is typically of the single sharpened point type, and when the rays of the exit electron beam are projected back, they form a virtual point source, typically measuring a few nanometers in diameter.

BACKGROUND

Any mention and/or discussion of prior art throughout the specification should not be considered, in any way, as an admission that this prior art is well known or forms part of common general knowledge in the field.

A cold field emission electron gun unit 100 usually consists of a pointed cathode wire 102 mounted on a support filament 104 and two circular anode disc plates 106, 108 with central holes that are aligned to a rotationally symmetric axis, as shown in FIG. 1. The gun unit's 100 rotational axis of symmetry also defines an optical axis around which the emitted electrons from the cathode 102 are accelerated and focused. The cathode 102 is usually biased to a negative voltage ($V_C$), and the anode plates 106, 108 are biased to voltages, $V_{A1}$ and $V_{A2}$, where $V_{A2} \gg V_{A1} \gg V_C$, creating a strong electric field for electron extraction and acceleration. The cathode 102 typically consists of a single crystal tungsten sharpened wire, etched in a specific plane (such as the <111> plane) to generate the lowest work function, and its tip radius is in the 100-200 nm range, as shown in FIG. 2. Electron emission from the cathode 102 occurs when the field strength at the cathode tip typically exceeds 4 V/nm, allowing electrons to escape from its surface by quantum tunnelling [1]. Returning to FIG. 1, as electrons are accelerated through the gun unit 100, the wide-angle ones are filtered out by the first and second anode plate 106, 108 holes, and they exit the gun unit 100 in the form of a rotationally symmetric electron beam which appears emanate from a single point on the axis of symmetry (virtual source). The relatively small virtual source size of cold field emission guns (a few nano-meters in diameter) is one of the main reasons for them having the highest brightness of all electron sources used in focused electron beam instruments. Another advantage is that they have a relatively low energy spread (0.2-0.3 eV), and it is these types of properties that make cold field emission sources the best type of electron source for forming nano-size electron probes with high current intensity.

Although cold field emission sources have desirable electron optical properties (high brightness and low energy spread), they suffer from some practical engineering problems that have limited their widespread use. One difficulty comes from the native oxide that forms on the cathode surface and subsequently quenches electron emission, requiring the use of Ultra High Vacuum (UHV) levels in the gun unit (<$10^{-10}$ Torr). Even at such stringent vacuum conditions, the intensity of electron emission falls in 1 to 2 hours of continuous operation and the cathode needs to be warmed or rapidly heated (flashed) regularly to blow off material. Another problem comes from residual gas molecules around the cathode tip which ionise positively under the impact of the emitted electrons. These positive gas ions are then attracted on to the cathode tip by its strong local electric field, causing large fluctuations in the final beam current and reducing the lifetime of the cathode. This phenomenon is known as the ion back-bombardment problem. The stringent vacuum level in the gun (UHV level) cannot eliminate this problem, and in practice, cold field emission guns have the largest current instability of all electron sources. The main difficulty comes from the presence of the strong local electric field strength around the sharpened cathode tip, required to produce quantum tunnelling for the emitted electrons. The degree of current instability and damage to the cathode tip depends on both the size of the cathode tip and the kinetic energies to which the back-bombarding gas-ions are accelerated to when they collide with the cathode surface.

In order for the electric field strength at the cathode surface to be strong enough for quantum tunnelling, the cathode tip is made as small as possible, and the applied field strength is normally increased until it is close to its maximum value, the value at which electric arcing occurs. Both the relatively small size of the cathode tip and the high applied field strength make the cathode tip more vulnerable to instability and damage by ion back-bombardment.

Cold field emission from graphene, a single layer of carbon atoms arranged in hexagonal lattices, has been reported in the context of creating micro-fabricated nanometer-scale sharp protrusions to localize and enhance an applied electric field, either by transferring graphene sheets onto metal/semiconductor nanotips [21, 22, 23,] graphene coating of Ni/Co nano-tips [24], or by forming vertically aligned graphene films [25, 26]. However, none of these methods are suitable for electron microscopy/lithography applications since they all consist of densely packed nano-emitters (tip radius <20 nm) that produce a large array of defocused overlapping electron beams, and therefore cannot be subsequently focused.

Conventional electron microscopy/lithography columns require a single cathode emission site, which then produces a single nanometer size virtual source point at the gun exit. Conventional single-tip sharpened wire cathodes not only produce single point virtual sources (typically one to two orders of magnitude smaller than the tip radius (100-200 nm)), but also have relatively large supporting wire dimensions (in the millimeter range), providing mechanical and thermal stability for the field emission.

So far, the only single tip emitters involving graphene consist either of overlaying an ultra-thin (~1 nm) graphene flake on to a blunted tungsten probe [27], or a graphene ring structure [9]. In the case of the loosely hanging ultra-thin and freestanding graphene flake, it cannot be used for practical applications, since the graphene flake can easily be damaged or detached from the supporting tungsten probe by back-bombardment of high-energy positive ions. In the case of the graphene ring cathode, it requires the use of a non-conventional electron beam column, one which forms a ring beam focus at the specimen plane, instead of the normal single point focus.

Embodiments of the present invention seek to address at least one of the above problems.

SUMMARY

In accordance with a first aspect of the present invention, there is provided a cathode structure for cold field electron emission comprising a pointed cathode wire; and a graphene-based coating on at least a tip of the pointed cathode wire.

In accordance with a second aspect of the present invention, there is provided a method of fabricating a cathode structure for cold field electron emission, the method comprising the steps of providing a pointed cathode wire; and coating at least a tip of the pointed cathode wire with a graphene-based material.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Embodiments of the present invention are based upon coating rounded cathode tips in the submicron to micron size range with graphene based materials in order to obtain cold field electron emission. A suitable material for the cathode according to example embodiments is a metal such as nickel, which is a catalyst for a few-layer graphene growth. Embodiments of the present invention utilize the better field emission/material properties of graphene based materials to improve the performance of cold field emission guns for focused electron beam applications. The potential advantages of graphene coated cathodes over conventional single crystal tungsten cold field emission cathodes include: less stringent vacuum requirements, higher total beam current, and less beam current fluctuations.

Figure 1:
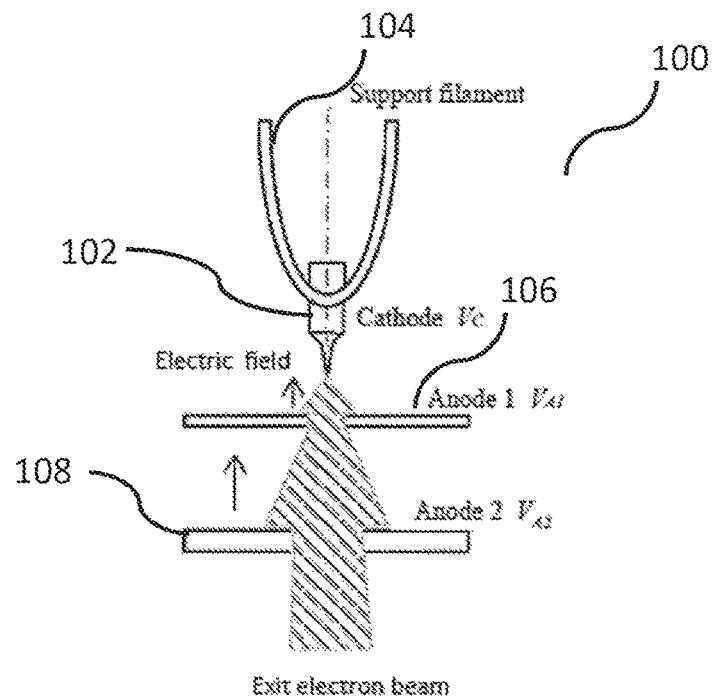
FIG. 1 shows a schematic diagram of a conventional cold field emission electron gun.
Figure 2:
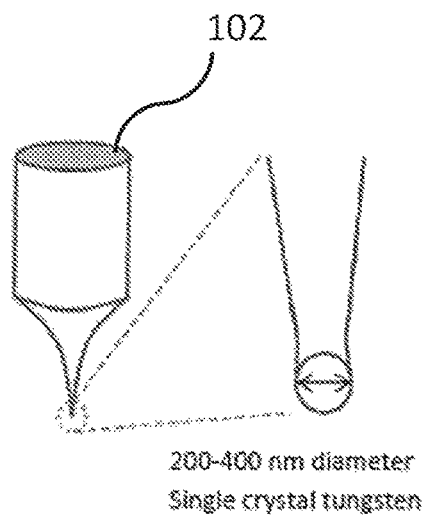
FIG. 2 shows a schematic of a conventional W<111> pointed cathode.
Figure 3:
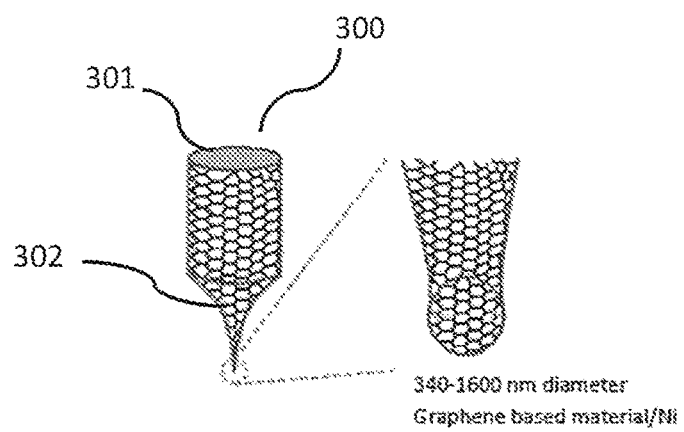
FIG. 3 shows a schematic of a graphene based material/Ni cathode in the submicron to micron size range, according to an example embodiment.

In example embodiments, the point cathode structure 300 for cold field emission guns comprises a cathode wire 301 coated with graphene based composite thin films 302 (Graphene, Graphene oxide (GO), rGO and their derivatives), on at least the tip of the cathode wire 301, in this embodiment on substantially the entire cathode wire 301, as shown in FIG. 3, in order to improve their field emission characteristics. Nickel metal is often used as a catalyst for a few-layer graphene growth, and is capable of growing uniform layers of graphene over large areas with high crystallinity through chemical vapor deposition (CVD). Adsorption of graphene on a series of metal substrates results in a lower work function. The work function of graphene significantly drops by chemisorption on Ni, Co and Pd, and decreases slightly by weak adsorption on Al, Cu, and Ag (all refer to plane metal). The practical effective work function of graphene on sharp tips according to example embodiments (e.g. 130 nm-800 nm) is below 2 eV. The further reduction of the work function of graphene according to example embodiments may be due to an increase in the graphene density of states, caused by the enhanced cathode tip electric field, on the order of 0.5-1.5 V/nm, raising the Fermi level. The lowering the work function value is theoretically predicted to be 3.66 eV compared to 4.5-4.6 eV for graphene, and 4.32-5.25 eV for single crystal tungsten [2], and will therefore advantageously require lower cathode tip electric field strengths in order to produce cold field emission.

One of the most important advantages of the graphene coated nickel cathode according to an example embodiment over the conventional metal cold field emitters is the chemical inertness of the carbon surface, which is less likely to adsorb residual gas molecules and much more stable. Moreover, a lower electric field strength requirement provides the possibility of using larger cathode tip sizes according to example embodiments, and also reduces the kinetic energies of back-bombarding positive ions. This leads to better current stability and less damage to the cathode tip (for a given vacuum level), and also makes it feasible to operate the gun at less stringent vacuum conditions according to example embodiments.

In an example embodiment, a few-layer graphene coating was grown on a 1 mm diameter polycrystalline nickel cathode pointed wire and inserted into an electron gun unit. Experimental results, described in detail below, demonstrate that stable cold field emission can be obtained for cathode-tip electric field strengths of around 0.5 V/nm, this is around an order of magnitude lower than the 4 to 5 V/nm required for conventional single crystal tungsten tips. The work function was experimentally measured to be below 2 eV. These results were produced in High Vacuum (HV) conditions ($10^{-8}$ Torr), with cathode tip radii ranging from about 130-800 nm. This is believed to be the first time stable electron emission has been experimentally obtained from a cold field emission gun with a single tip cathode diameter in the micron range and in HV conditions. In the category of electron guns used to produce focused electron beams, cathode tip diameters in this size range normally require some form of external heating, such as the Schottky electron source [3].

The experimental results also indicate that there is no obvious need for regular flashing (heating) of the cathode. The beam current was captured by a Faraday Cup, and together with the local tip field strength and first-order optics parameters determined by simulation, gun brightness estimates were made. The experimental results predict that the graphene coated nickel cathode according to an example embodiment has better or comparable brightness to conventional cold field emission guns. This improved field emission performance comes not only from the lower work function of the graphene-on-metal coating, but also from the fact that the coating provides chemical and mechanical protection. Graphene has a relatively high mechanical strength combined with excellent electrical conductivity and thermal stability [4].

It is noted coating the cathode tip of cold field emission guns has been previously limited to providing chemical and mechanical protection against the formation of a contamination film on the cathode and mitigating the effect of ion back-bombardment, examples such as a single crystal tungsten metal tip coated with oxide, nitride or carbon compounds were suggested [5]. However, it has been recognized by the inventors that any proposal for coating the cathode tip needs to also account for its field emission properties. Up to now, experiments demonstrating the enhanced field emission properties of graphene coating have been restricted to densely packed nano-cone structures [6], dot emitter arrays [7,8], or ring-cathodes [9], none of which can be inserted into a conventional cold field emission gun unit in order to provide a point virtual source (a few nanometers in diameter) suitable for focused electron beam applications.

In contrast, embodiments of the present invention demonstrate that the enhanced field emission properties of graphene coating can be used to improve the performance of point-cathode type cold field emission guns.

In other embodiments, a graphene coated point cobalt cathode may be used, since cobalt, like nickel, also serves as a catalyst for graphene, and the graphene-cobalt combination, also has a relatively low work function [2]. Other metals (Pd, Al, Cu, Ag and so on) combined with graphene may also lower the effective work function, and the present invention is also applicable to those combinations in different embodiments.

In some embodiments of the present invention, the wire cathode, e.g. the nickel wire cathode, is placed into the gap of a magnetic circuit; magnetic flux will then travel through the nickel wire and produce a high magnetic field strength which will then fall sharply, similar in form to the electric field strength. This has the potential to improve not only the optics of the gun, producing a higher angular beam density by a collimation effect, but also likely to improve the lifetime of the cathode.

The embodiments of the invention described herein are for a sharpened graphene coated nickel wire cathode that can be placed into a cold field electron gun module, suitable for generating a focused electron beam. In principle, an array of such wire cathodes can be inserted into an array of holes in a common cathode plate according to an example embodiment, inserted into a gun module that has an array of holes in a common set of anode plates; in such embodiments, the present invention can supply a parallel array of focused electron beams.

Experimental Results According to Example Embodiments

This section presents experimental results carried out by the inventors demonstrating that it is possible to obtain cold field emission current from graphene coated nickel wire cathodes according to example embodiments, and that such embodiments are likely to have important advantages over conventional single crystal tungsten wire cathodes for cold field emission. A two-step process was used for the fabrication of Graphene-Ni point cathodes according to example embodiments: 1) Ni wires of 1 mm in diameter were electrochemically etched to obtain a sharp Ni tip. The anode electrode of a Ni wire was clamped and threaded at the center through a Pt ring with a diameter of 10 mm. A film of 7.2% HCl aqueous solution was suspended in the Pt ring which acted as the electrolyte. A constant DC current of 0.15-0.2 A was applied to trigger the electrochemical reaction. In case the film broke at any point of time, the process was paused, the film was recreated using supplies of electrochemical etching solution and the process was resumed. When etching is complete the bottom portion of the Ni wire separates with a very sharp tip with tip radii ranging from about 130 nm to 800 nm. 2) The deposition of a few-layer graphene is achieved by using the CVD method with solid carbon source PMMA (poly(methyl methacrylate)) as feedstock. The obtained Ni tip was placed in a ceramic holder positioned at the center of the tube furnace. An $Al_2O_3$ boat loaded with 200 µL PMMA (Microchem Corp. 950 PMMA A9, 9% in anisole) was put in an oven at 80° C. for 30 min, which was then placed at the gas inlet side of the quartz tube, just outside of the heating zone. The Ni template at the center of the furnace was annealed to 900° C. in a 500 sccm $Ar/H_2$ (95%/5%) flow for 5 minutes. The solid PMMA source was subsequently heated by a heating tape wrapped around the quartz tube to a temperature of 150° C. for 8 minutes. After growth, the furnace was opened for fast cooling. This method is based on the precipitation of carbon on a Ni surface during the cooling process, and it has the advantages of being a low-temperature process and avoids the need for any toxic/explosive gases like methane. Further details of the CVD set-up and method used will be described below with reference to FIG. 17. All field emission experiments were carried out in a high vacuum (HV) test chamber where graphene coated nickel wire cathode was inserted into an experimental electron gun setup. A 1 mm hole anode plate was used and the beam current was collected by a Faraday Cup. The cathode tip radius ranged from 130 to 800 nm for these experiments.

Figure 4:
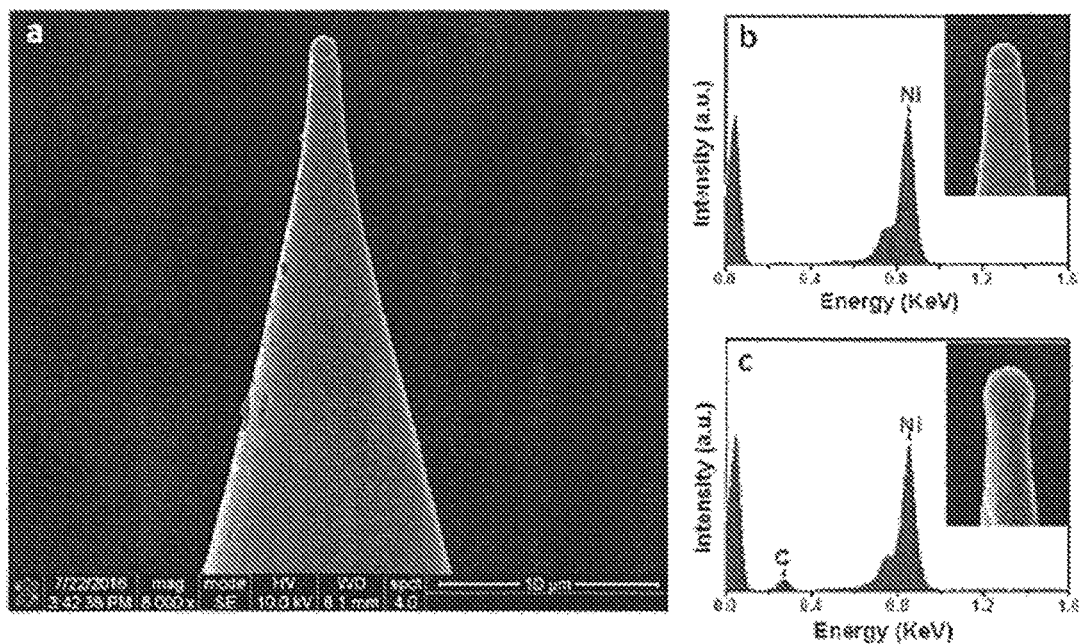
FIG. 4(a) shows an SEM image of an as-made Ni tip from electrochemical etching at a low magnification.
FIG. 4(b) shows an EDS spectrum of the as-made Ni tip; inset shows the corresponding SEM image.
FIG. 4(c) shows EDS spectrum of the Ni tip after graphene coating, according to an example embodiment; inset shows the corresponding SEM image.

FIG. 4a shows the scanning electron microscopy (SEM) image of an as-etched Ni cathode wire having a tip radius of 450 nm. The process to coat the nickel cathode wire in this example embodiment was done by CVD at a moderate temperature, as reported elsewhere [9]. The resulting tip is coated with graphene that has a smoother appearance, and it is displayed in the inset of FIG. 4c. To confirm that the nickel cathode wire is successfully covered with graphene, energy-dispersive X-ray spectroscopy (EDS) was employed to examine the chemical compositions. FIG. 4b and FIG. 4c show the EDS spectra of the nickel cathode wire, before and after a few-layer graphene is grown on it, respectively. As it can be observed, a carbon peak is present after the CVD coating process indicating the presence of graphene. The few-layer graphene was also confirmed to be monocrystalline.

Figure 5:
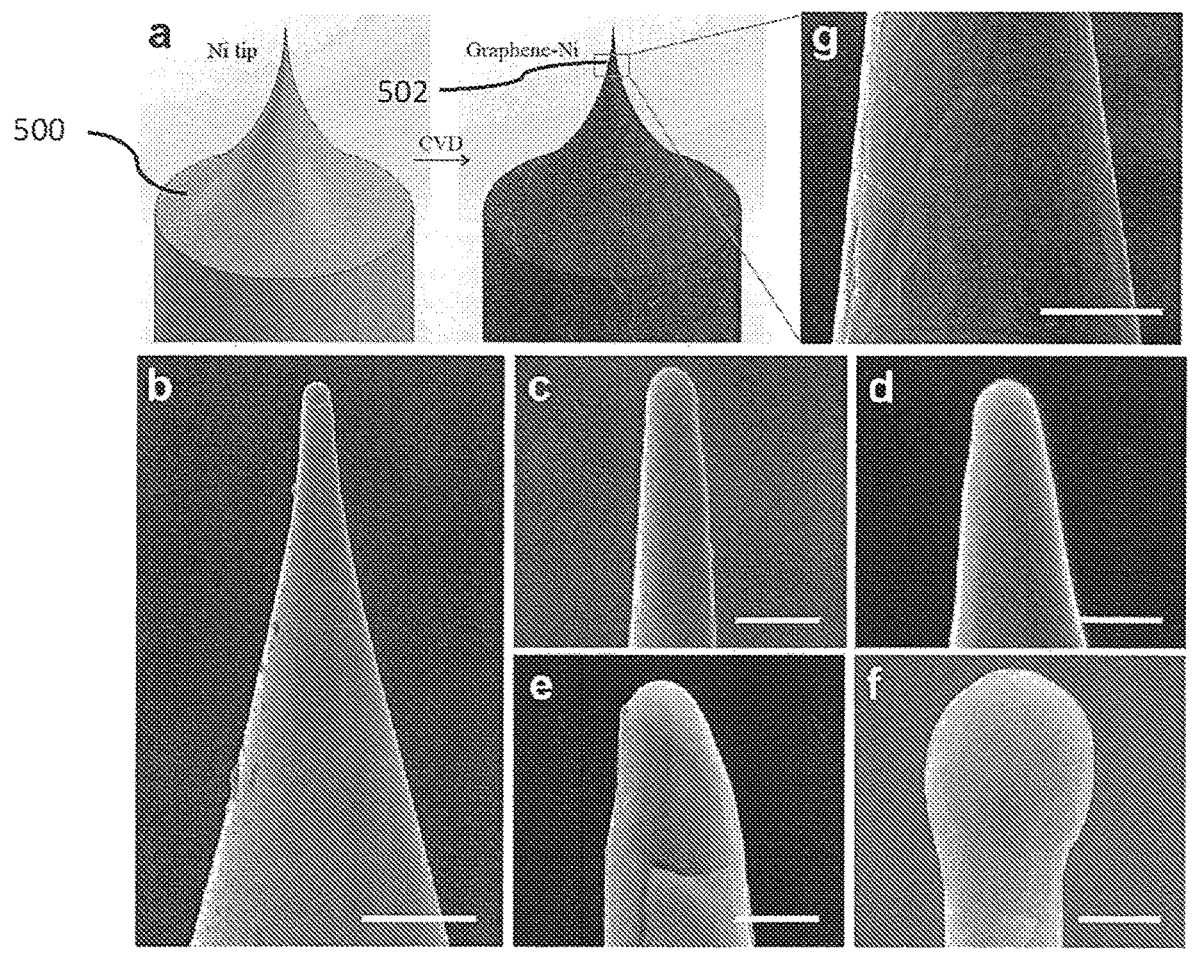
FIG. 5(a) shows an illustration of the fabrication of a graphene coated point cathode, according to an example embodiment.
FIG. 5(b) shows an SEM image of as-etched Ni tip from electrochemical etching at low magnification showing supporting wire.
FIG. 5(c) shows an SEM image of graphene coated point cathodes of tip radius 210 nm, according to an example embodiment.
FIG. 5(d) shows an SEM image of graphene coated point cathodes of tip radius 300 nm, according to an example embodiment.
FIG. 5(e) shows an SEM image of graphene coated point cathodes of tip radius 480 nm, according to an example embodiment.
FIG. 5(f) shows an SEM image of graphene coated point cathodes of tip radius 800 nm, according to an example embodiment.
FIG. 5(g) shows an SEM image of the lateral surface of the emitter, according to an example embodiment.

The two-step process used for the fabrication of graphene coated point cathodes according to an example embodiment is illustrated in FIG. 5a. Ni wires 500 of 1 mm diameter were electrochemically etched to obtain a sharp Ni tip with tip radii ranging from 130 nm to 800 nm (see SEM image in FIG. 5b). These were then used as catalysts and templates for the growth of few-layer graphene via CVD process at a moderate temperature (<900° C.) to avoid any morphological change to the Ni tip 502. Details of this growth process according to an example embodiment are described below.

Typical SEM images of the graphene-coated Ni tips (of four different tip radii according to example embodiments) as depicted in FIGS. 5c-f show that the electrochemically etched, smooth surface of the Ni tip apex is overlaid with a continuous, homogeneous and smooth graphene film, and no morphological fluctuations are observed. Due to the ultra-thin nature of the few-layer graphene, the grain boundaries of the underlying polycrystalline Ni, formed by high temperature annealing during the CVD process, are visible in FIG. 5g. Wrinkles are observed only on the lateral surface of Ni where graphene was grown, which was possibly induced by thermal-stress around step edges and defect lines [11].

Figure 6:
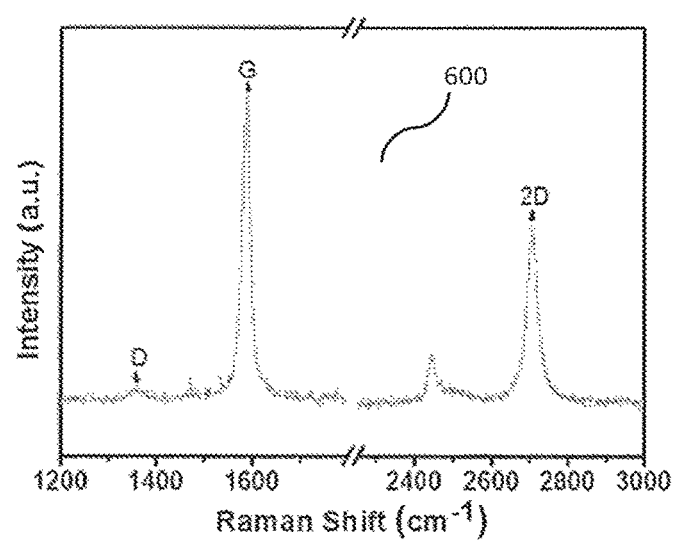
FIG. 6 shows a typical Raman spectrum obtained from the surface of Ni tip coated with graphene, according to an example embodiment, with a 532 nm excitation laser.

To gain insight of the quality and film thickness of the as-deposited graphene, a Raman spectrum 600 acquired on the graphene coated nickel wire tip cathode according to an example embodiment is shown in FIG. 6. It exhibits typical features of few-layer graphene: (i) a ~0.568 2D/G peak intensity ratio and (ii) a symmetric 2D band centered at ~2705 $cm^{-1}$ having a full width at half maximum (FWMH) of 29.9 $cm^{-1}$. The D peak located at ~1356 $cm^{-1}$ associated with $sp^3$-hybridized carbon is close to the background level, suggesting that the structural defects are relatively insignificant and the deposited graphene film exhibits high graphitic crystallinity.

Figure 7:
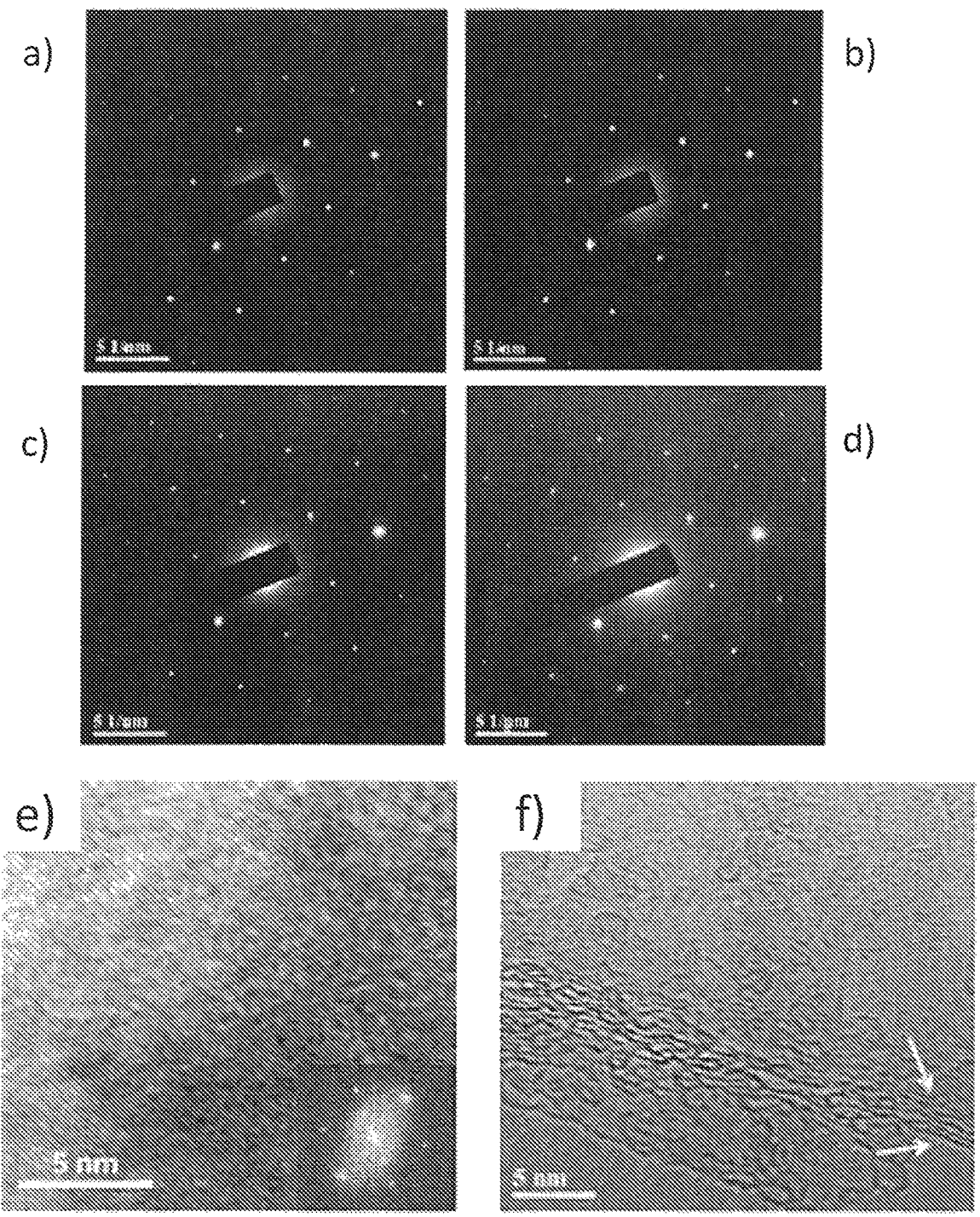
FIGS. 7(a) to (d) shows selected area electron diffraction (SAED) pattern acquired on different regions of a graphene flake taken from an emitter according to an example embodiment.
FIG. 7(e) shows a high resolution TEM (HRTEM) image of the graphene surface according to an example embodiment, showing the lattice fringes, and inset is the corresponding FFT pattern from the HRTEM image.
FIG. 7(f) shows an HRTEM image on the edge of a graphene flake taken from an emitter according to an example embodiment.

A graphene flake was extracted from the surface of the graphene coated emitter according to an example embodiment. Selected area electron diffraction (SAED) and high resolution transmission electron microscopy (HRTEM) were used to further investigate the crystallinity, lattice structure and the thickness of the graphene flake. The SAED pattern (FIG. 7a) of the graphene flake reveals a hexagonal pattern, which signifies its single-crystalline nature, with an in-plane lattice constant of 2.61±0.09 Å (compared to 2.46 Å for graphite [12]). Different regions of the graphene flake were examined and the results consistently indicated the high crystallinity of the deposited graphene film. FIG. 7b to FIG. 7d show SAED patterns acquired from different regions of the graphene surface according to an example embodiment, showing that well-defined patterns were observed indicating the high crystallinity of the graphene according to example embodiments.

A HRTEM image is shown in FIG. 7e, with its corresponding fast Fourier transform (FFT) pattern in the inset. The lattice fringes along the in-plane direction of the graphene layer can be clearly observed and its crystallinity is confirmed. A few-layer graphene features are observed on the flake edges from the HRTEM image, as shown in FIG. 7f, which is in agreement with the data obtained using Raman spectroscopy. The interlayer spacing was estimated to be 3.50±0.20 Å.

Figure 8:
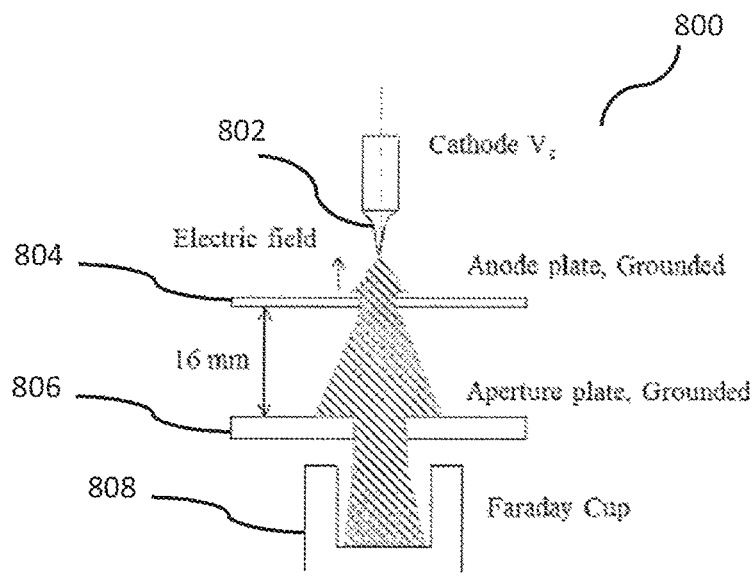
FIG. 8 shows a schematic diagram of the experimental electron gun that was used to measure I' for emitters according to example embodiments.

An experimental cold field emission electron gun setup 800, as shown in FIG. 8, was used to obtain the field emission characteristics of the graphene coated point cathodes. The emitter tip 802 was positioned about 0.5 mm away from a grounded anode hole plate 804 having a radius of 0.5 mm, and was aligned to a grounded hole aperture 806 (radius of 0.5 mm) placed in front of a Faraday Cup 808. The distance of the aperture 806 was adjusted to 16 mm, restricting the semi-angle entry to 30 mrad, corresponding to a collection solid angle of 3×10$^{-3}$ sr. The test setup 800 was subsequently placed in a high vacuum (4×10$^{-8}$ torr) chamber for field emission tests. A negative voltage ($V_c$) was applied to the cathode (while the rest of the setup was grounded) and the current leaving the anode plate 804, referred to here as total current ($I_t$), and the current reaching the Faraday Cup 808, referred to here as the sample current ($I_s$), were recorded.

Figure 9:
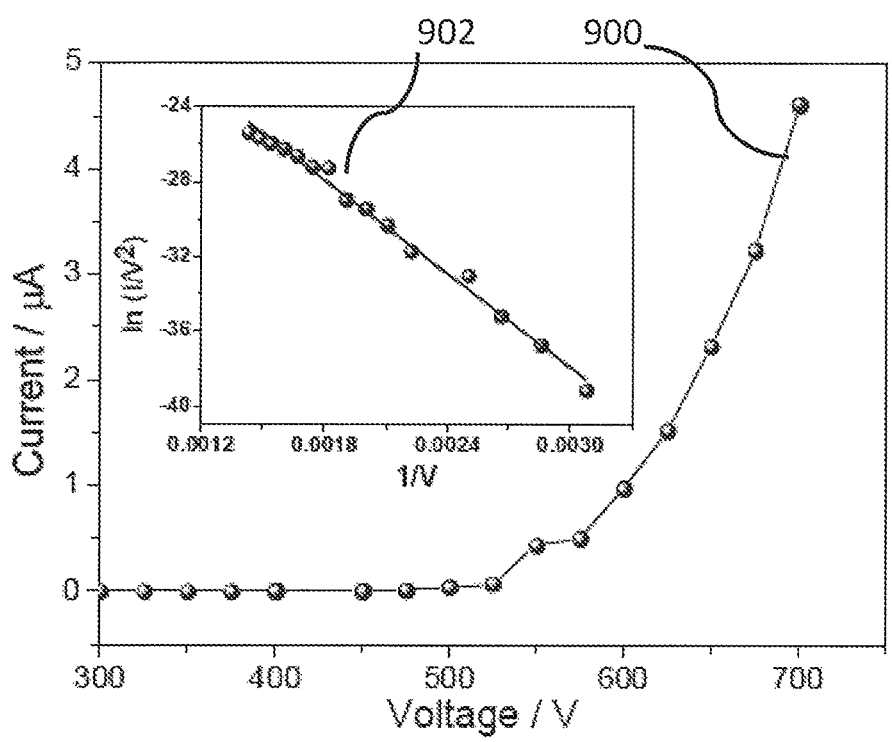
FIG. 9 shows experimental field emission characteristic of single Ni tip coated with graphene, according to an example embodiment.

The experimental I-V curve 900 of the graphene coated nickel wire cathode according to an example embodiment that has a tip radius of 450 nm is depicted in FIG. 9. A high emission current of ~5 μA was obtained at a relatively low applied field of ~1.45 V/μm ($V_{ext}$=700V, d=0.48 mm) in the HV vacuum level of 5×10$^{-8}$ torr. The emission current increases exponentially with applied voltage, which follows typical Fowler-Nordheim (F-N) tunnelling behavior 902.

Moreover, lifetime test of the graphene coated wire tip cathode according to an example embodiment was performed in the vacuum level of 5×10$^{-8}$ torr, and the emission current with a mean value of 0.34 pA was maintainable over 72 hours. SEM inspection of the graphene coated nickel wire tip cathode after the 72 hours lifetime test showed no visible morphology change. The short term (300 seconds) current fluctuations were found to be less than 10% (standard deviation value) in the vacuum level of 5×10$^{-8}$ torr.

Figure 10:
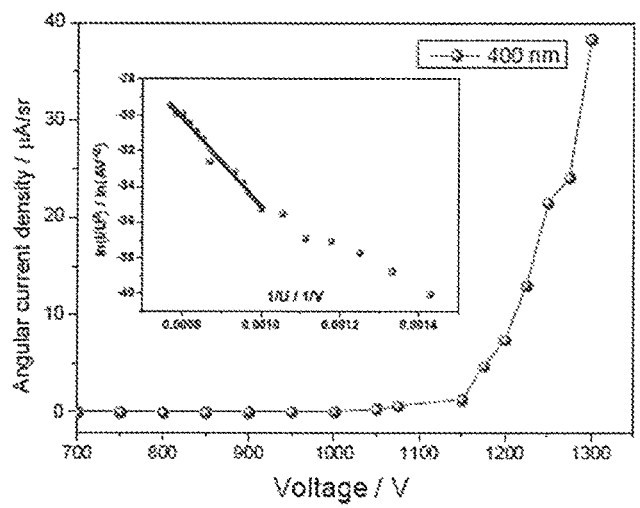
FIG. 10 shows the dependence of the angular current density on extraction voltage with a maximum value limited by emission instability, and the inset shows the corresponding F-N plot, according to an example embodiment.

The good performance of the lifetime and current stability is attributed to the relatively large tip diameter and the comparatively lower electric field strength. The dependence of the angular current density on extraction voltage is shown in FIG. 10 for a cathode tip radius of 400 nm according to an example embodiment, and the maximum recorded angular current density before the onset of emission instability was found to be 38 μA/sr.

Figure 11:
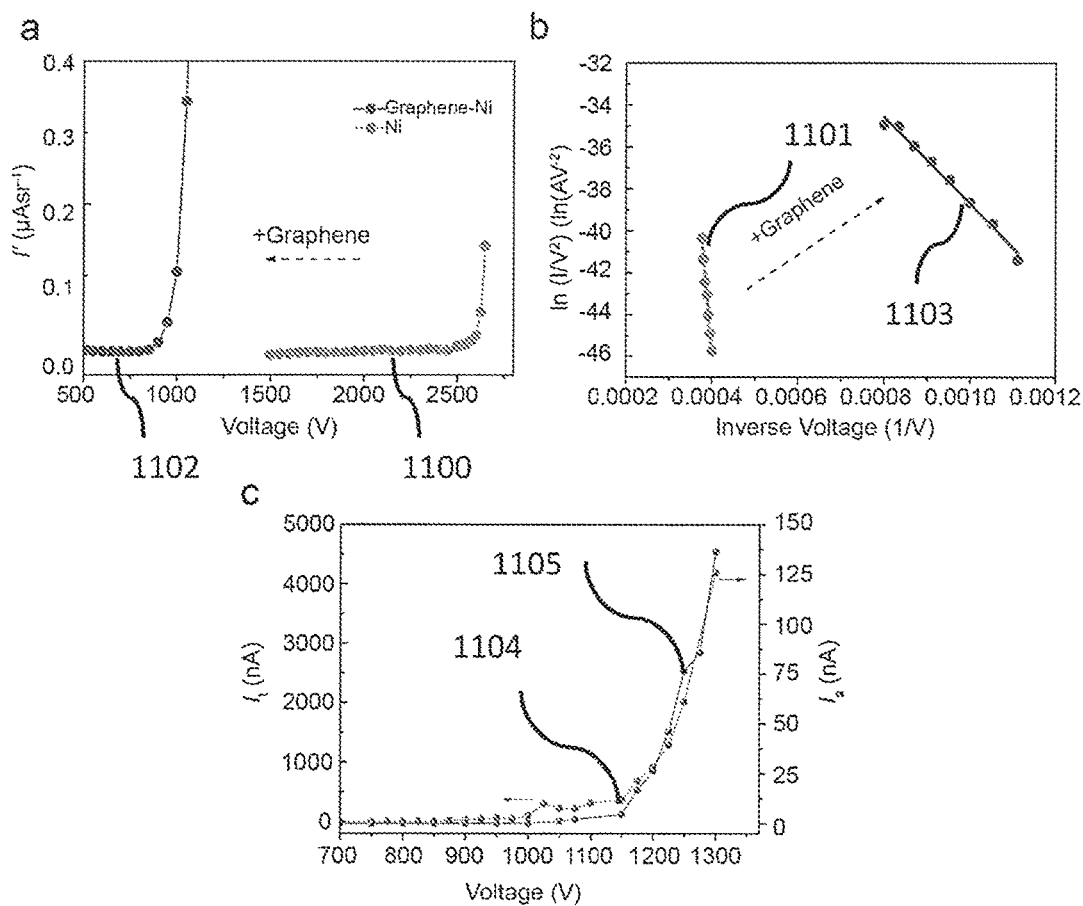
FIG. 11(a) shows field emission angular current density-voltage traces from the Ni tip emitter with a tip radius of 700 nm before coating with graphene, and after coating with graphene, according to an example embodiment.
FIG. 11(b) shows the F-N plots from FIG. 11(a).

FIG. 11a and FIG. 11b present the field emission angular current density-voltage trace and the corresponding F-N plot from the Ni tip emitter with a tip radius of 700 nm according to an example embodiment before coating with graphene (curves 1100, 1101), and after coating with graphene (curves 1102, 1103). The pristine Ni tip has a turn on voltage of around 2600 V, and a pure Ni work function is 5.35 eV. A few-layer of graphene was then grown onto the Ni tip emitter at a moderate temperature by CVD to avoid any morphological change, resulting in a significant drop in turn on voltage to 950 V, corresponding to an effective work function of 1.1±0.1 eV. The effective work function is calculated by plotting ln(I/V$^2$) versus 1/V (FIG. 11b), having a slope (−6.44×10$^9$φ$^{1.5}$d/β) that depends on d, φ, and β, where d is the cathode-anode distance, β is the field enhancement factor and φ is the tip work function. Because the addition of graphene does not change the tip geometry according to example embodiments, the errors in estimating d and β can be eliminated by extracting the effective work function from the ratio of the two F-N slopes (by using the work function of nickel φ$_{Ni}$=5.35 eV).

These experimental results demonstrate that it is possible to obtain stable cold field emission from micron size tip diameter under the HV conditions, establishing the promising prospect of using them as pointed cathodes for cold field emission sources, according to example embodiments.

The measured ($I_t$-$V_c$) (curve 1104) and ($I_s$-$V_c$) (curve 1105) emission characteristics for a graphene-cathode of tip radius of 400 nm according to an example embodiment are plotted in FIG. 11c. It can be observed that the field emission current increases exponentially as the cathode becomes more negative, following a typical Fowler-Nordheim (F-N) curve [13]. The F-N formula is given as:

$$I = A \frac{1.5 \times 10^{-6}}{\phi} \left(\frac{V}{d}\right)^2 \beta^2 \exp\left(-\frac{6.44 \times 10^9 \phi^{1.5} d}{\beta V}\right) \quad (1)$$

Where A has the dimension of area [m$^2$], φ is the work function in [eV], d is the anode to emitter spacing, V is the applied voltage [volts], and β is the field enhancement factor. The total current ($I_t$) reaches a maximum value of 4.2 μA, at which point $I_s$ was recorded to be 136 nA, corresponding to a maximum normalized angular current density I'$_N$ value of 34.8 pA sr$^{-1}$ kV$^{-1}$, where I'$_N$ is normalized to the cathode potential. This recorded value of I'$_N$ is approximately 1.4 and 8.6 times greater than that reported for corresponding conventional single crystal tips, W(310) tip and W(111) tip [1, 14], respectively.

Figure 18:
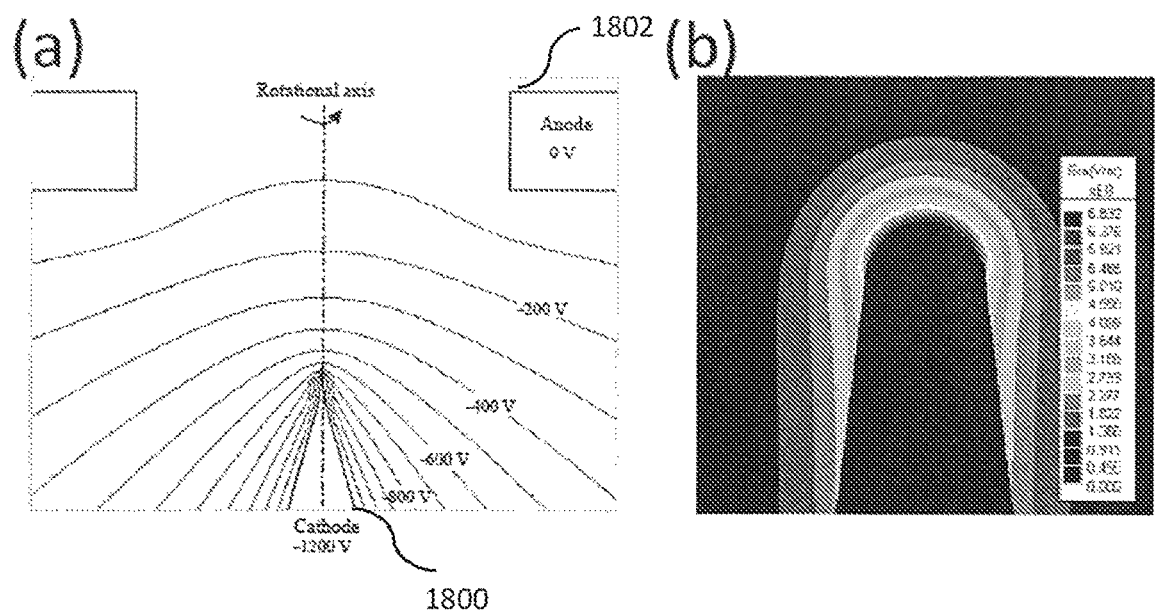
FIG. 18(a) shows an example of equipotential plot in equal voltage intervals of a graphene coated cathode according to an example embodiment.
FIG. 18(b) shows the contour of electric field strength on the emitter tip of radius 500 nm, according to an example embodiment.

One of the stand out features of the Ni few-layer graphene coated point cathodes according to example embodiments described herein is their ultra-low work function values. This significant finding was extracted from the experimental results shown in FIG. 11a and FIG. 11b. Work function estimates were extracted from the slope of the graph in the F-N plot, the cathode to anode distance (d), and field enhancement factor (β), using a method described below with reference to FIG. 18. The distance d was measured accurately in a SEM, and SEM imaging also provided an estimate of the tip radius, which was approximated to be spherical in shape.

The Lorentz-2EM boundary element software [15] was then used to numerically solve for the potential field distribution around the tip, and derive a simulated value for the field enhancement factor β. The work function estimates from the F-N plots using this method were calculated to be 5.80 eV for the bare Ni tip, and 1.03 eV for graphene coating Ni tip according to an example embodiment. The 5.80 eV value for the bare Ni tip agrees within 6% of the one reported previously for bulk Ni by other researchers [2], confirming that the work function estimates derived from the present experiment are relatively accurate. Further confirmation of the accuracy comes from calculating the work function for the graphene coated Ni tip by taking the ratio of the two F-N plots shown in FIG. 11b (with and without graphene coating on the same Ni tip, curves 1103 and 1101, respectively), and using the previously reported work function value for bulk Ni, avoiding the need to use values for both d and β. The work function value for the graphene coated Ni tip using this second method was calculated to be 1.1 eV, giving better than 7% agreement with the value (1.03 eV) derived directly from the F-N plot using d and β, more details are given in the description below with reference to FIG. 18.

Figure 19:
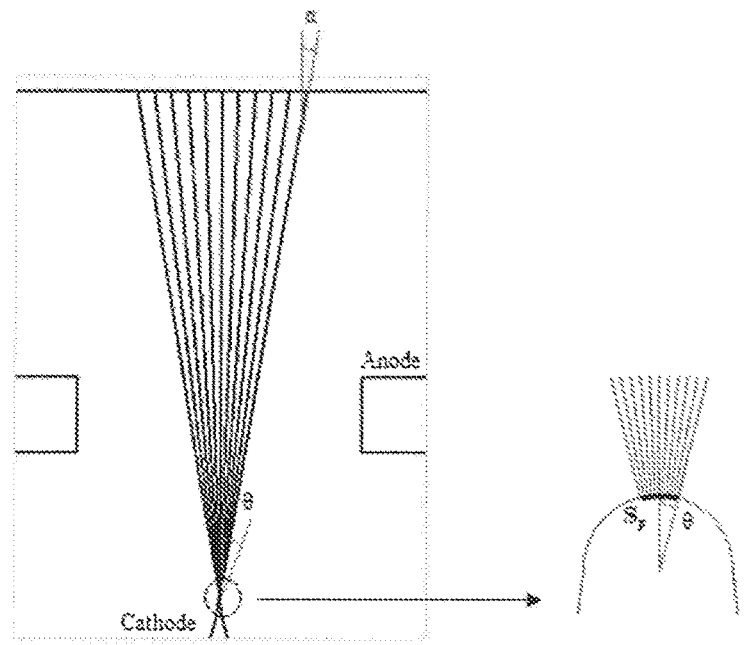
FIG. 19 shows a schematic diagram illustrating determination of the angular magnification, m=α/θ, where α is the final extraction angle and θ is the initial emission angle.

The cathode surface area $S_p$ which contributes to the current collected by the Faraday Cup was also estimated using simple direct ray tracing simulations; this information is used to exclude the possibility of emission from wrinkles in the graphene contributing to the sample current, as will be described below in more detail with reference to FIG. 19.

There are two mechanisms that help explain the significant lowering of the work function according to example embodiments: i) n-type doping of graphene due to chemisorption on Ni, which reduces the work function to the order of 0.5-1.0 eV [2], and ii) an increase in the graphene density of states, caused by the enhanced cathode tip electric field, on the order of 0.5-1.5 V/nm, raising the Fermi level [16, 17]. The combination of these two effects is most likely responsible for the dramatic reduction of work function value according to example embodiments; as measured here, a value of 1.1 eV which, to the best of the inventors' knowledge, is the lowest reported value for single-tip pointed cathodes.

For electron microscopy/lithography applications, electron sources of high source reduced brightness $B_r$ are typically required, and it can be estimated from the following expression [18]:

$$B_r = 1.44 \frac{eI'}{\pi <E_t>} \left(\frac{m_\alpha}{a}\right)^2 \quad (2)$$

Where I' is the angular current density, $m_\alpha$ is the angular magnification, α is the tip radius, and $<E_t>$ is the mean tangential energy. For cold field emission, $<E_t>$=ehF/√(8mφ) [18], where F is the local electric field, φ is the work function, and h is the reduced Planck constant. Direct ray tracing of electron trajectory paths leaving the cathode surface using the Lorentz-2EM software were carried out to estimate ma and F and when used together with the measured angular current density I', gun brightness $B_r$ estimates were obtained, as will be described below in more detail with reference to Table 3. Br values for graphene coated point cathodes according to example embodiments versus their tip radii are presented in FIG. 12a. The data in the plot can be broadly grouped into three categories: high brightness tungsten cold field emitters with very small tip radii (<200 nm) 1201, 1202 [1, 14], Schottky emitters having relatively low brightness with large tip radii (~1000 nm) 1203 [19], and graphene coated point cathodes having tip dimensions according to example embodiments 1204, that roughly fall in the middle region. The estimated Br value of 2.51×10⁹ A/m²srV of a graphene coated cathode of tip radius 170 nm according to an example embodiment is very close to the highest reported $B_r$ value of 2.7×10⁹ A/m²srV for a conventional tungsten cold field W(310) emitter with a tip radius of 160 nm [1], and is higher than the value of 9.86×10⁸ A/m²srV for a W(111) emitter with a tip radius of 120 nm [13].

It is worth noting that Br values from even larger size tips according to example embodiments are still relatively high and comparable to the $B_r$ value obtained from the state-of-art tungsten field emitters. For better comparison, a summary of the typical operating parameters for the graphene coated point cathode according to example embodiments, the tungsten field emitter and the Schottky emitter is listed in Table 1.

TABLE 1

| Source | T(K) | φ (eV) | I' (μA/sr) | a (nm) | F (V/nm) | $m_\alpha$ | $<E_t>$ (eV) | $d_e$(nm) | $B_r$(A/m²srV) | Ref. |
|---|---|---|---|---|---|---|---|---|---|---|
| W(310) | 300 | 4.32 | 62 | 175 | 4.33 | 0.50 | 0.20 | 4.0 | 1.14 × 10⁹ | 6 |
| W(111) | 300 | 4.40 | 15 | 120 | 4.206 | 0.62 | 0.186 | 2.29 | 9.86 × 10⁸ | 5 |
| SE | 1800 | 2.79 | 200 | 1000 | — | 0.18 | — | 56 | 1.90 × 10⁷ | 6 |
| G-Ni | 300 | 1.1 | 40.7 | 170 | 0.958 | 0.56 | 0.078 | 4.55 | 2.51 × 10⁹ | This work |
| G-Ni | 300 | 1.1 | 45.5 | 400 | 0.781 | 0.63 | 0.073 | 7.95 | 7.05 × 10⁸ | This work |
| G-Ni | 300 | 1.1 | 11.4 | 800 | 0.564 | 0.68 | 0.061 | 12.69 | 6.22 × 10⁷ | This work |

Clearly, the graphene coated point cathodes according to example embodiments exhibit relatively large values of Br due primarily to the large value of I' and the substantially small value of $<E_t>$ as a result of the low local electric field strength F required to produce electron emission.

The stability of the electron beam is of major concern for focused electron beam applications. Conventional cold field emission electron sources are prone to instability due to the dynamics of residual gas adsorption and ion back-bombardment. A lower turn-on electric field is desirable for cold field emitters since it will reduce the kinetic energies up to which the back-bombarding gas ions are accelerated to when they collide with the cathode surface. The local electric field strength, F, required to achieve an angular current density of 5 μA/sr for graphene coated point cathodes of different tip radii according to example embodiments are plot in FIG. 12b (data points 1205). The local field strength was estimated by using the enhancement factor derived from simulation, as will be described below in more detail with reference to FIG. 18.

For comparison, the electric field strength required to obtain the same angular current density from widely used tungsten cold field emitters (data points 1206, 1207) and Schottky thermal emitters (data points 1208), as reported previously, are plot on the same graph [1]. It is clear that there is around an order of magnitude reduction in the local electric field strength requirement for the graphene coated pointed cathodes according to example embodiments as compared to the field strength required for tungsten cold field emitters, typically in the range of 0.49-1.67 V/nm, which is comparable to the value of 0.5 V/nm reported for the Schottky thermal field emitter [19]. These findings help to explain why the graphene coated point cathode according to example embodiments is able to provide stable field emission for micron diameter cathode tips and operate in much less stringent vacuum conditions.

Figure 12:
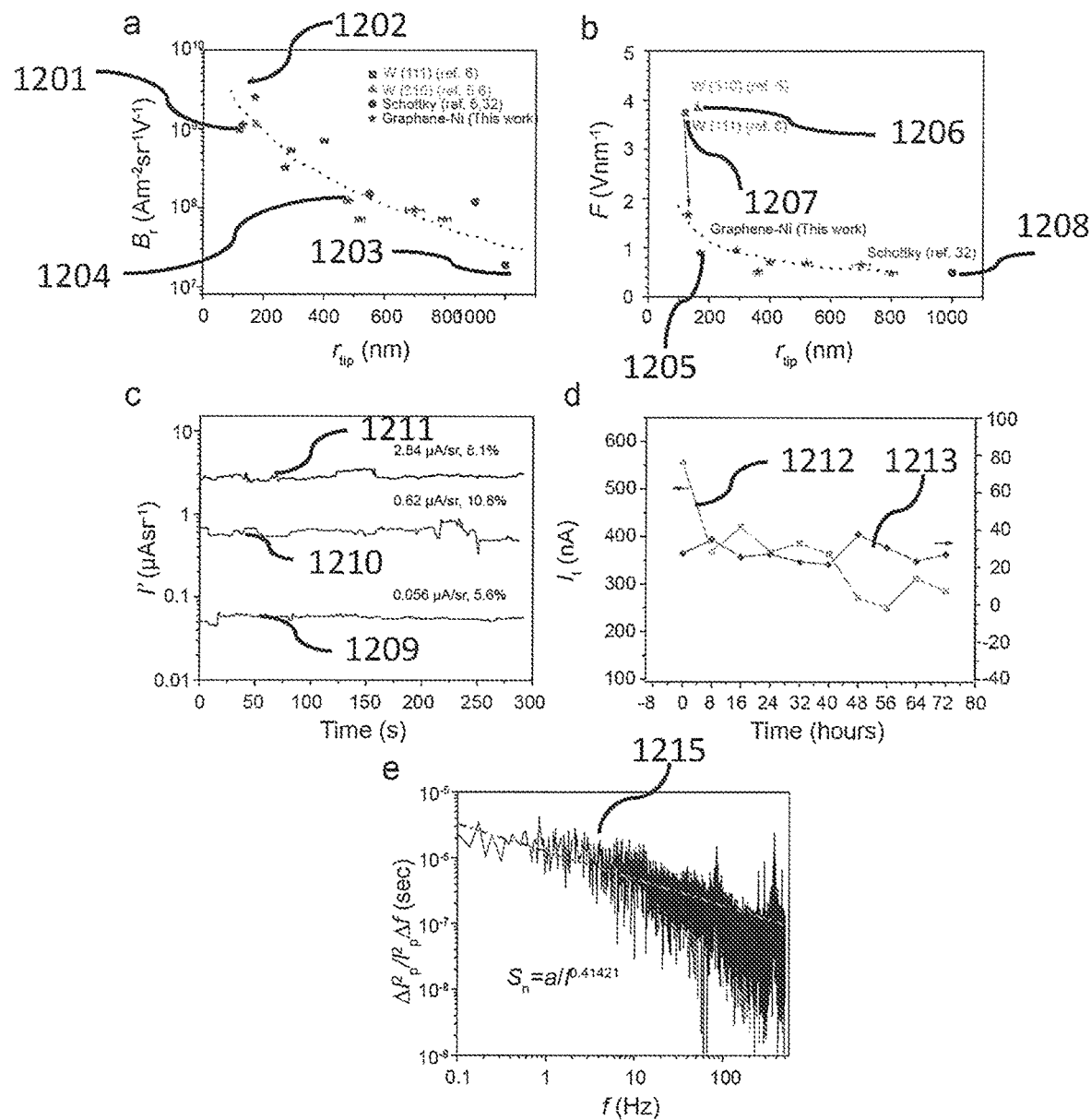
FIG. 12(a) shows a comparison of reduced brightness according to example embodiments, to other field emission sources.
FIG. 12(b) shows the local electric field strength versus tip radius according to example embodiments, and the state-of-the-art electron sources.
FIG. 12(c) shows the short term current stability curve of the graphene coated point cathode according to an example embodiment.
FIG. 12(d) shows the averaged total emission current over each period (8 hours) versus time for 3 days (red), and the corresponding RMS noise ratio, according to example embodiments.
FIG. 12(e) shows the power spectrum analysis of the probe current (1.5 nA) with a sampling rate of 1 kHz for a time span of 30 s, for a graphene coated point cathode according to an example embodiment.

The degree of current instability and damage to the cathode tip not only depends on the kinetic energies of the back-bombardment ions, but also the size of the cathode tip. It is theoretically predicted that the root mean square (RMS) noise ratio ($<\delta I^2>^{1/2}$/I) varies inversely with the emission surface area, under constant conditions of temperature and pressure [1, 20]. Since for the same emission angle, a larger radius tip has a greater area of emission, the relatively large diameter graphene coated cathode tips (in the micrometer range), according to example embodiments, are therefore expected to have an order of magnitude lower RMS noise ratio values as compared to conventional tungsten cold field emitters. FIG. 12c depicts the typical short-term current stability (~300 seconds) of a graphene coated point cathode (tip radius of 360 nm according to an example embodiment) for sample currents (Is) of ~0.168 nA, ~1.86 nA, and ~8.52 nA, which corresponds to angular current densities of ~0.056 μA/sr (curve 1209), ~0.62 μA/sr (curve 1210), and ~2.84 μA/sr (curve 1211), respectively. Stepwise changes in emission currents were observed and such fluctuations may be attributed to events such as adsorption, desorption, or flip-flop of adsorbate molecules at the tip of the emitter [34]. The short-term RMS noise ratios were calculated to be in the range of 5%-10%, relatively low for the HV conditions in which they were taken, confirming the better performance expected by theoretical considerations (for larger tip sizes according to example embodiments).

To further verify the structural robustness of the graphene coated point cathodes according to example embodiments, $I_t$-t traces 1212 were obtained by recording $I_t$ every 8 hours for 3 days as shown in FIG. 12d. The total current was initially observed to be around 560 nA, which decreased to 370 nA in the first 8 hours, beyond which no further decay was observed. This good long-term current stability is much better than for conventional tungsten field emitters whose emission decay can be as high as 70%-90% within the first hour of operation, after which, periodic flashing is required [5]. In the case of the graphene coated cathode according to example embodiments, there was no obvious need for flashing of the cathode-tip.

Figure 13:
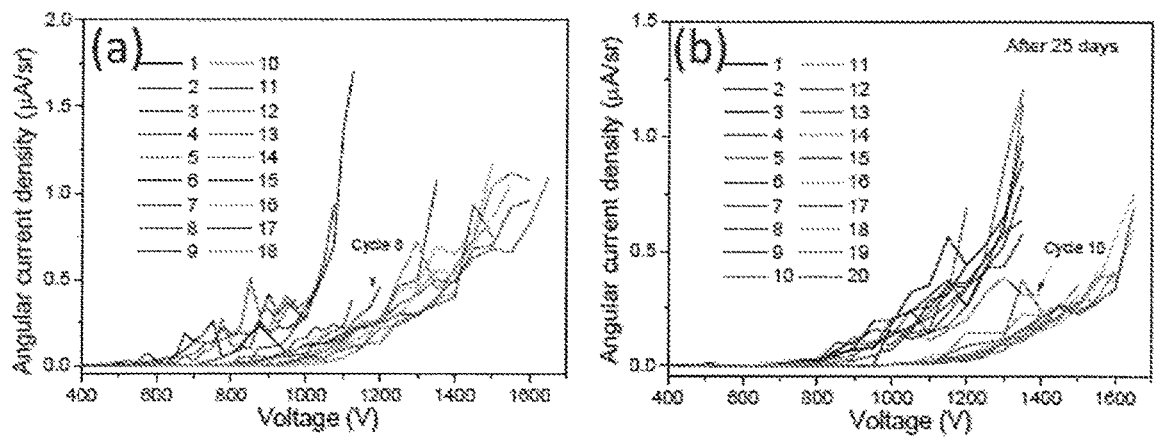
FIG. 13(a) shows cyclic measurements of field emission of a 700 nm radius tip graphene coated cathode, according to an example embodiment.
FIG. 13(b) shows cyclic measurements taken from the same tip as FIG. 13(a) after 25 days.

The RMS noise ratios 1213 were found to be between 20% to 30% in each 8-hour period throughout the 3-day test duration. Repeated field emission tests of the graphene coated point cathode according to example embodiments were carried out in a HV chamber to verify the reproducibility of the field emission characteristics. Eighteen cycles of I'-V curves were obtained from a cathode of tip radius of 700 nm according to an example embodiment and is shown in FIG. 13a, where the angular current density was kept below 2 μA/sr. Beyond the initial eight runs, a shift of the I'-V curve to the right was observed after which it remained stable with no further shift.

After leaving the tip according to an example embodiment in the HV chamber for 25 days without emission, another round of twenty cycles of I'-V curves were measured, as shown in FIG. 13b. The I'-V characteristics largely look similar in both rounds of testing. The shift of the I'V curve to the right after some initial cycles may be attributed to the expelling of the adsorbate molecules over time and can be considered as a part of a "preconditioning" process. These results confirm that the graphene coated point cathode according to example embodiments has highly repeatable field emission characteristics.

The frequency characteristics of the electron emission process according to example embodiments was investigated by plotting the normalized spectral density $S_n(f) = \delta I^2 / \bar{I}^2 \Delta f$ of the experimentally detected probe current, as shown in the FIG. 12e. The spectrum 1215 was obtained by the fast Fourier transform (FFT) of a probe current (1.5 nA) with a sampling rate of 1 kHz for a time span of 30 s. Integration leads to the RMS noise ratio percentage $\delta I^2 >^{1/2} / \bar{I} = 0.413\%$ or a signal to noise ratio of 242 in the frequency range 0.1-25 Hz. This measured value is lower than that obtained from a conventional tungsten cold field emitter [28] (~2-5%, P~10⁻¹⁰ torr, T=25° C.), and is comparable to that obtained from carbon nanotubes emitters [29] (~0.2%, P~6×10⁻⁸ torr, T=500° C., I=2.4 nA) and Schottky emitters [30] (~0.23%, P~10⁻⁸ torr, T=1527° C., I=30 nA) for the same frequency range.

A preliminary estimate of the energy spread was carried out predicting that the graphene-coated Ni point cathode according to example embodiments exhibits comparable energy spread to the conventional W(310) cold field emitter.

Specifically, an analytical expression for the total energy distribution (TED) of electron emission in the thermal field regime was first derived by Young [31] based on the free-electron model as:

$$P(E) = \frac{J_{FN}}{d} \left[ \frac{\exp\left(\frac{E - E_i}{d}\right)}{1 + \exp\left(\frac{E - E_i}{kT}\right)} \right] \quad (3)$$

where kT=0.155 eV at room temperature, $J_{FN}$ is the Fowler-Nordheim emission current density and d is the tunneling parameter (in eV) given by:

$$d = 9.76 \times 10^{-11} \frac{F}{\phi^{1/2} t(y)} \quad (4)$$

where F and ϕ are the electric field strength (in V/m) and work function (in eV) respectively. The variable t(y) is a slowly-varying function of y=3.79×10⁻⁵ $F^{1/2}/\phi$ and can be approximated by the formula t(y)=1+0.1107 $y^{1.33}$. The analytical formula is valid [32] provided kT/d<0.7 and y<1.

Figure 14:
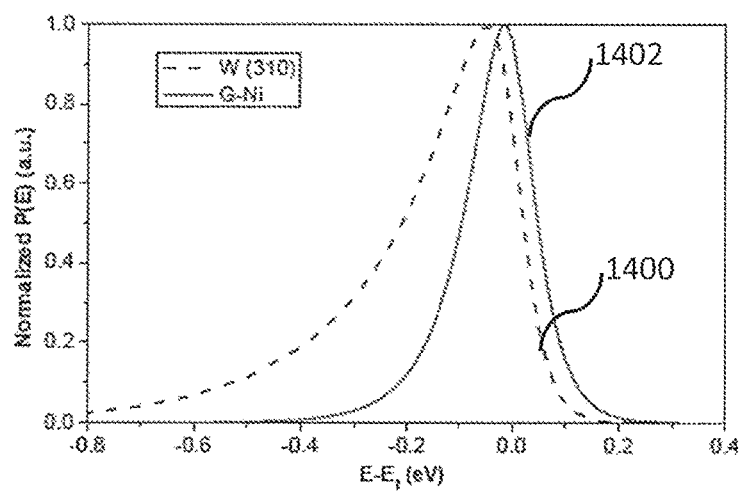
FIG. 14 shows room-temperature total energy distributions for a typical W(310) cold field emitter ($\phi$=4.32 eV, F=4.34 V/nm) and a graphene-Ni emitter according to an example embodiment ($\phi$=1.10 eV, F=0.781 V/nm).

FIG. 14 shows the room-temperature total energy distribution (TED) for a typical W(310) cold field emitter (plot 1400) as well as for a graphene-coated Ni tip (plot 1402) according to an example embodiment. From the plots 1400, 1402, the intrinsic full-width at half-maximum (FWHM) energy spreads are calculated to be 0.23 and 0.14 eV, respectively. The smaller predicted intrinsic FWHM of the Graphene-Ni cathode according to example embodiments compared to the typical W(310) cold field emitter (by 60%), comes mainly from its smaller field strength requirement.

The intrinsic TED of electron emission is only one contributor to the energy spread, and another contribution comes from longitudinal Coulomb interactions (also known as Boersch effect).

Unlike the situation for TED, lower electric fields (lower extraction voltage), enlarge the energy spread caused by the Boersch effect, according to Knauer's model. According to the Knauer's model [33] of a spherical electric field around an emitter of tip radius $r_{tip}$, the energy broadening (in eV) due to Coulomb interactions is given by the formula:

$$\Delta E_{Boersch} = 15.9 \frac{(I')^{2/3}}{r_{tip}^{1/2} V_{ext}^{1/2}} \quad (5)$$

where I' is the angular current density and $V_{ext}$ is the extraction voltage.

As a first approximation, the total source energy spread can be calculated from quadratic addition (root-mean-square sum) of the Boersch effect and the intrinsic energy spread calculated from the TED:

$$\Delta E_{total} = (\Delta E_{intrinsic}^2 + \Delta E_{Boersch}^2)^{1/2} \quad (6)$$

Values of $\Delta E_{intrinsic}$, $\Delta E_{Boersch}$, and $\Delta E_{total}$ are given in Table 2 for a typical W(310) tip [1] and a few selected Graphene-Ni tips of cathodes according to example

TABLE 2

| Source | $r_{tip}$ (nm) | $V_{est}$ (V) | $I'$ ($\mu$Asr$^{-1}$) | $d_v$ (nm) | $B_r$ (Am$^{-2}$sr$^{-1}$V$^{-1}$) | $\Delta E_{intrinsic}$ (eV) | $\Delta E_{Boersch}$ (eV) | $\Delta E_{total}$ (eV) |
|---|---|---|---|---|---|---|---|---|
| W(310) | 160 | 4255 | 62 | 2.98 | $2.09 \times 10^9$ | 0.232 | 0.283 | 0.366 |
| Graphene-Ni | 170 | 975 | 40.7 | 4.55 | $2.51 \times 10^9$ | 0.144 | 0.342 | 0.371 |
| Graphene-Ni | 400 | 1300 | 45.5 | 8.27 | $7.09 \times 10^8$ | 0.140 | 0.252 | 0.288 |
| Graphene-Ni | 800 | 1450 | 11.4 | 11.79 | $7.23 \times 10^7$ | 0.136 | 0.077 | 0.156 |

The energy spread caused by the Boersch effect is predicted to be larger for the Graphene-Ni cathode according to example embodiments compared to a typical W(310) cold field emitter (by a factor of around 20% higher for the 170 nm radius tip), but the total estimated energy spread from the combined TED distribution and Boersch effect is approximately the same. These considerations indicate that for the smaller tip sizes (around 170 nm radius), the smaller energy spreads expected for the Graphene-Ni cathode compared to conventional tungsten cold field emitters (of comparable tip size) based upon the TED distribution, will be approximately off-set by the Boersch effect, and the total energy spread for the two emitters is therefore expected to be comparable.

It is interesting to note that since both the TED distribution and Boersch effect on energy spread decrease with increasing tip radius, a significantly smaller energy spread is predicted for the 800 nm radius Graphene-Ni tip (a factor of two smaller than that of the 170 nm radius tip). This would ordinarily not be possible for conventional large field emitters (tip-diameters over one micron), such as the Schottky emitter, since the Schottky field emitter only functions by heating the tip up to 1800 K, enlarging the energy spread by thermal effects to around 0.5 eV. These preliminary analytical considerations point towards new opportunities for obtaining smaller energy spreads with the Graphene-Ni cathode according to example embodiments, which comes from its ability to produce stable field emission from relatively large cathode tip radii.

Figure 15:
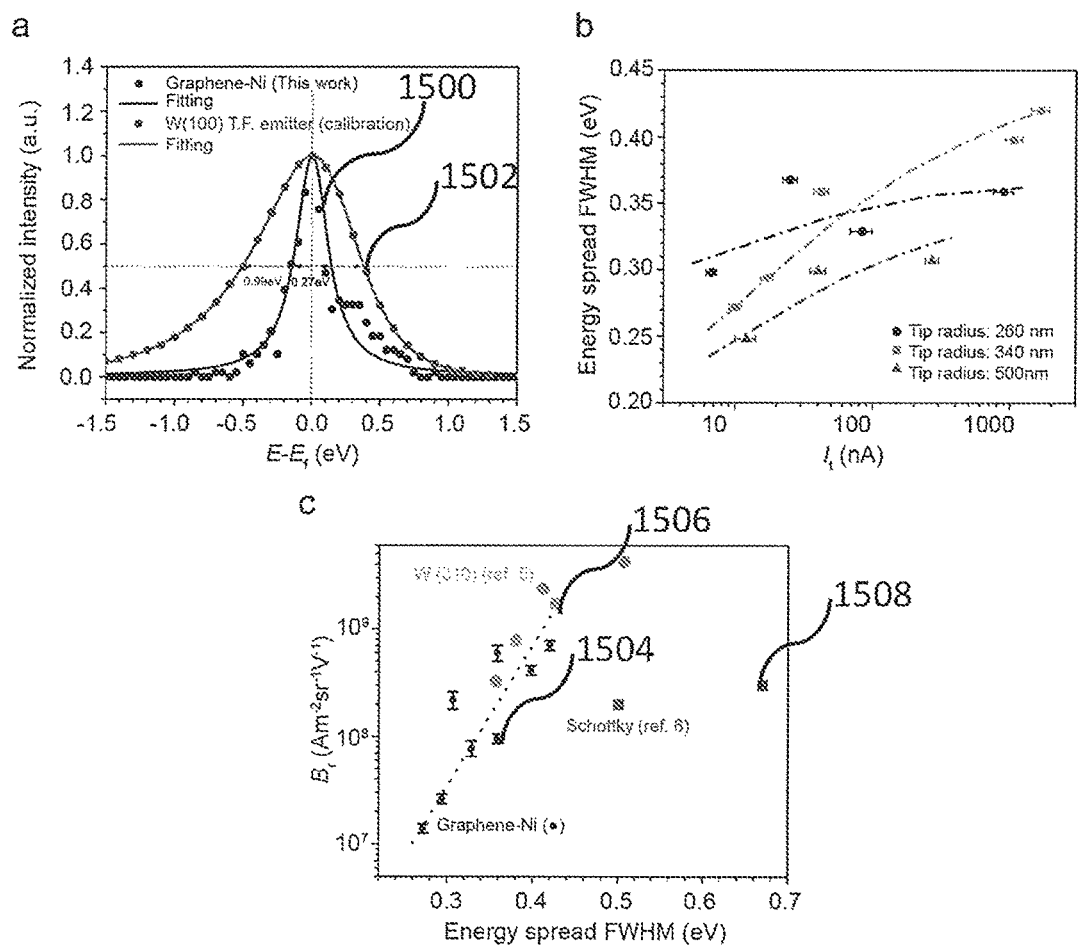
FIG. 15(a) shows the electron energy distribution from a graphene-Ni tip with a radius of 340 nm according to an example embodiment emitting at a total emission current of 10 nA and an angular current of 0.1 $\mu$A/sr. The pass energy and the dwell time for measurement are 10 eV and 0.1 s, respectively. A W(100) T.F. emitter was employed to calibrate the electron analyzer (Focus Electronics CSA 200).
FIG. 15(b) shows the energy spread FWHM versus total emission current obtained from different tip sizes according to example embodiments. The uncertainty in the x-axis (5-10%) is due to the current instability.
FIG. 15(c) shows the reduced brightness versus energy spread for electron sources according to example embodiments and for state-of-the-art electron sources. The uncertainty in the y-axis is from the determination of tip size and current instability.

FIG. 15a shows an experimentally measured energy spread distribution 1500 for the Graphene-Ni electron point source according to an example embodiment, using a commercial high-resolution energy analyzer, shown alongside the energy spread 1502 of a W(100) thermal field (T.F.) Schottky emitter used for calibration purposes. The beam intensity in the y-axis is normalized to each signal's peak height, while the energy spread on the x-axis is defined with respect to the Fermi Energy. The graphene-Ni tip of the electron point source according to the measured example embodiment has a radius of 340 nm, a beam voltage of 0.8 kV, while a beam voltage of 1.1 kV was used for the Schottky emitter. In both cases, the analyzer pass energy was set to 10 eV. The FWHM of 0.27 and 0.99 eV was measured for the Graphene-Ni electron point source according to the measured example embodiments and W(100) T.F. electron emitter, respectively.

Figure 16:
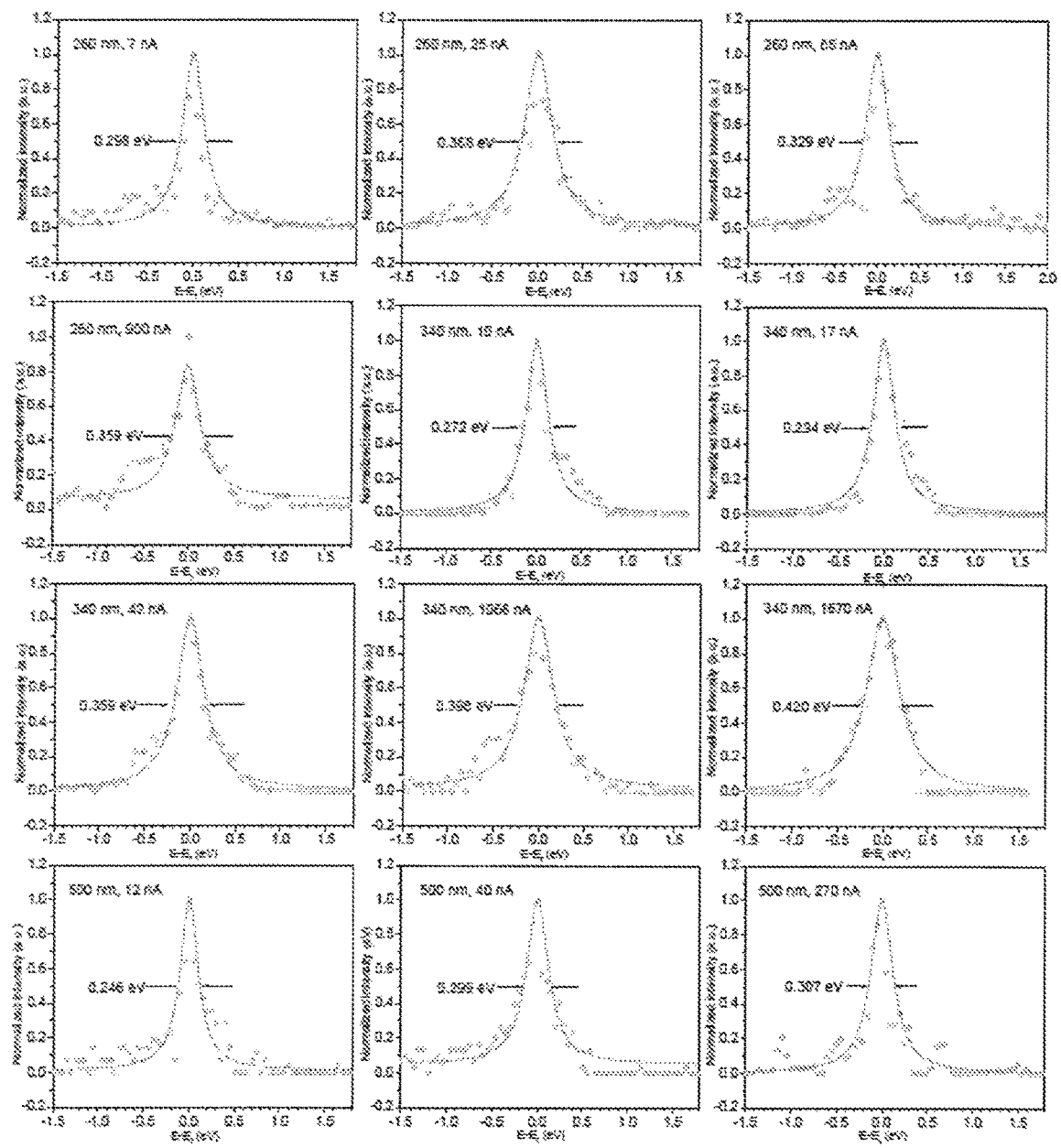
FIG. 16 shows experimentally measured energy spread of graphene-Ni electron point sources according to example embodiments.

FIG. 15b compares data obtained for different Graphene-Ni tip radii (260 nm, 340 nm and 500 nm) according to example embodiments, the data being extracted from the measurements shown in FIG. 16. The FWHM values increase with increasing total emission current. The lowest measured value is 0.246 eV obtained from a tip with a radius of 500 nm emitting at a total emission current of 12 nA.

Plotted in FIG. 15c is the reduced brightness versus energy spread for three different emitters according to example embodiments e.g. data point 1504, shown alongside the state-of-the-art tungsten cold field emitter e.g. data point 1506 [1] and Schottky emitter e.g. data point 1508 [14]. The error bar is calculated by error propagation due to the uncertainty in the tip radius (±30 nm) and the instability in the emission current (±5%). The overall energy spread values are lower than or comparable with state-of-the-art conventional cold field emission sources. This is due to the lower work function $\phi$ for emitters according to example embodiments, described above. As predicted by the analytical calculations described above, the small energy spreads expected for the Graphene-Ni cathode according to example embodiments will be approximately off-set by the Boersch effect for the small tip sizes, and the total energy spread of emitters according to example embodiments is thus comparable to conventional tungsten cold field emitters.

In summary, the experimental results demonstrate that by using a few-layer graphene coated Ni wire point cathode according to example embodiments, it is possible, for the first time, to obtain stable cold field emission for electron microscopy and lithography applications in HV conditions, and additionally, use relatively large point cathode tip diameters (in the micron range). The feasibility of using such large size tips and relatively poor vacuum conditions comes from their experimentally measured ultralow work function value of 1.1 eV. The estimated reduced brightness, as well as the measured energy spread, of these cold field emission sources according to example embodiments is similar to or better than comparable conventional single crystal tungsten cathode cold field emission sources. These results establish the promising prospect of using emission sources according to example embodiments as high brightness high-resolution electron sources for electron microscopy and lithography applications, similar in performance to conventional single crystal tungsten cathode cold field emission sources, while at the same time having better emission stability and less stringent vacuum requirements.

Figure 17:
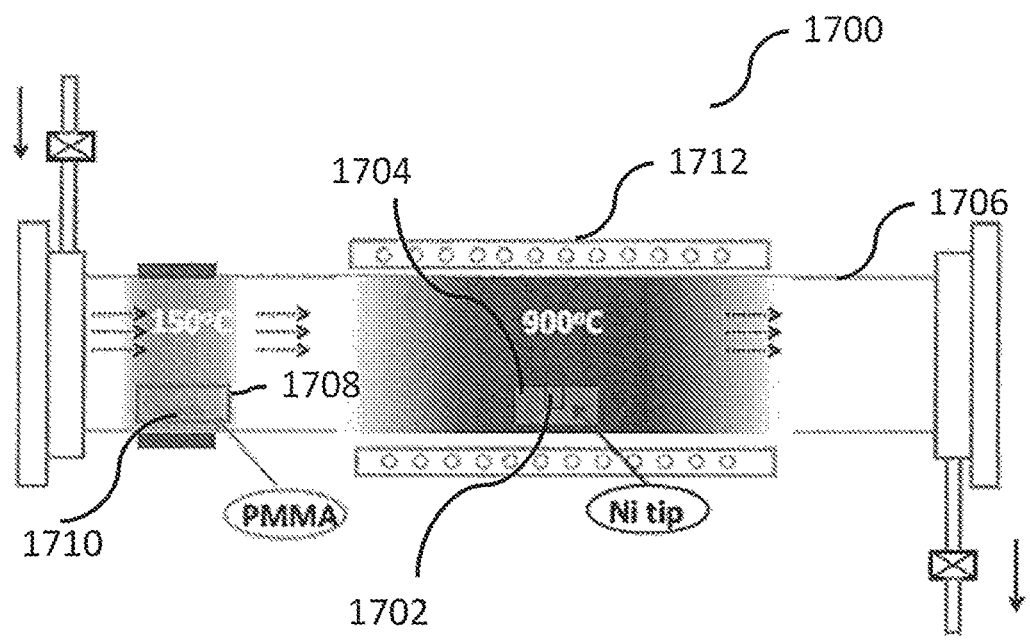
FIG. 17 shows a schematic illustration of a CVD set up for fabrication of graphene coated cathodes according to an example embodiment.

Preparation of a Few Layer Graphene Coated Point Cathode According to Example Embodiments A typical electrochemical etching process was used for preparing a sharp Ni tip having a radius of a few hundred nanometers [9]. The sharp Ni tip serves as a template and catalyst for the growth of graphene. In example embodiments, the deposition of a few layer graphene is achieved by using the chemical vapor deposition (CVD) method with solid carbon source (PMMA) as feedstock, since this method avoids the use of high temperatures which may change the morphology of the sharpened tip. FIG. 17 illustrates the schematic of the CVD set up 1700 used. As shown in the schematic, the Ni tip 1702 was placed in a ceramic holder 1704 positioned at the center of the tube furnace 1706. An Al$_2$O$_3$ boat 1708, loaded with solid PMMA 1710 was placed at the inlet side of the quartz tube furnace 1706, just outside of the heating zone 1712. The Ni tip 1702 was then either heated to 900° C. for tip diameters greater than 400 nm or heated up to 800-850° C. for tip diameters less than 400 nm maintaining a 500 sccm Ar/H$_2$ (95%/5%) flow. The solid PMMA 1710 source was then heated to 150° C. for 8 minutes after the furnace reaches the set temperature. After this, the furnace was simply opened for the precipitation/formation of few layer graphene on the Ni tip 1702.

Microstructural Characterization of Example Embodiments

The microscopic morphologies of the cathode according to example embodiments were investigated by using a scanning electron microscope equipped with EDS (FEI Nova 230). The crystallinity and thickness of the graphene were examined by Raman spectroscopy (WITecCRM200 with 532 nm laser (2.33 eV excitation), and a high resolution transmission electron microscope (JEOL 2100FEF, 200 KeV).

Work Function Measurements of Example Embodiments

According to the simulations from Lorentz-2EM boundary element software [15], one example of equipotential plot in equal voltage intervals is shown FIG. 18a. The cathode 1800 is biased at −1200 V relative to the grounded anode 1802 which is placed at 0.5 mm away. The resulting local field strength F was found to be 0.68 V/nm on the tip as shown in FIG. 18b. In this diagram, the field enhancement factor fi is defined as the ratio of the local electric field strength at the apex F over the applied field E, which is equal to the cathode voltage, U, divided by the cathode-tip to anode distance, d, i.e.

$$\beta = \frac{F}{E} = \frac{Fd}{U} \qquad (7)$$

The Fowler-Nordheim law is normally used to describe the field emission behavior from metallic surface, and is given by [13]:

$$I = A \frac{1.5 \times 10^{-6}}{\phi} \left(\frac{U}{d}\right)^2 \beta^2 \exp\left(-\frac{6.44 \times 10^9 \phi^{1.5} d}{\beta U}\right) \qquad (8)$$

This equation (8) can be re-written as:

$$\ln\left(\frac{I}{U^2}\right) = \ln\left(\frac{1.5 \times 10^{-6} \beta^2 A}{d^2 \phi}\right) - \frac{6.44 \times 10^9 \phi^{1.5} d}{\beta}\left(\frac{1}{U}\right) \qquad (9)$$

A plot of ln(I/U$^2$) against 1/U will have a slope of m=−(6.44×10$^9$φ$^{1.5}$d/β). This slope depends on φ, d, and β. Since the value of d is fixed in the experimental setup, and m is obtained from the slope of the F-N plot, the work function value φ can be estimated if the field enhancement factor fi is known. The field enhancement factor β can be extracted from performing direct ray tracing of electron trajectory paths by simulation as shown above (equation 7), and the work function can be calculated by:

$$\phi = 1.5\sqrt{\frac{-m\beta}{6.44 \times 10^9 d}} \qquad (10)$$

It is important to first validate the accuracy of this approach by using it to experimentally measure the work function of the bare Ni tip, before it is coated with graphene according to example embodiments. The work function for the bare Ni tip is expected to agree with previous reported values for bulk Ni [2]. As already described above, the work function measurements for bare Ni tip using formula (10) were found to be 5.80 eV (compared to 5.47 eV for bulk Ni), showing an accuracy of 94%. Once this was established, the work function for the Ni coated graphene according to example embodiments can be found by using two F-N plots, one for the bare Ni tip, and one for the graphene coated Ni tip according to example embodiments, and then take the ratio of their F-N slopes, eliminating d and β, and calibrate the graphene coated work function value relative to that measured for the bare Ni tip (verified by comparison to previous reported values for bulk Ni). This procedure assumes that the addition of graphene according to example embodiments does not change the tip geometry (as confirmed by SEM imaging described above). From the ratio of the two F-N slopes, the effective work function is calculated from:

$$\phi_{Graphene+Ni} = \phi_{Ni} 1.5\sqrt{\left(\frac{m_{Graphene+Ni}}{m_{Ni}}\right)} \qquad (11)$$

Where $\phi_{Graphene+Ni}$ and $\phi_{Ni}$ are the work functions of graphene coated pointed cathode according to example embodiments and bare Ni cathode, respectively, $m_{Graphene+Ni}$ and $m_{Ni}$ are the slopes of the F-N plot for graphene coated point cathode according to example embodiments and bare Ni cathode, respectively. The local electric field strength F and β were obtained by numerically solving for the electric potential distribution using the Lorentz software.

Cathode Emission Surface Area, S$_p$, Determination of Example Embodiments

The direct ray tracing simulations, using Lorentz-2EM boundary element software (reference), were used to determine the angular magnification m$_α$, defined as:

$$m_\alpha = \frac{\alpha}{\phi} \qquad (12)$$

Where α is the final extraction angle and θ is the initial emission angle, as shown in FIG. 19a and FIG. 19b.

The cathode emission area Sp is given by:

$$S_p = 2\pi \times \alpha^2 (1 - \cos\theta) \qquad (13)$$

By using a Faraday cup with a small acceptance aperture (restricting the semi-angle entry to 30 mrad), emission current is collected only from a small cathode emission area S$_p$. The calculated S$_p$ for different tip radii, a, according to example embodiments is presented in Table 3. For tip radii in the range of 130-800 nm, S$_p$ was estimated to be in the range of 130-3965 nm$^2$ (as obtained from equation (13)). These S$_p$ values are much smaller than the individual domain sizes bounded by wrinkles in the graphene coating (typically observed for areas greater than 1 μm×1 μm), eliminating the possibility that emission from wrinkles in the graphene coating contributed to the current collected by the Faraday Cup.

TABLE 3

| Tip No. | a (nm) | I' (μA/sr) | $m_a$ | θ (rad) | $S_p$ (nm$^2$) | $d_v$ (nm) | $B_r$ (A/m$^2$srV) |
|---|---|---|---|---|---|---|---|
| 1 | 130 | 12.1 | 0.613 | 0.049 | 129.6 | 3.54 | 1.12 × 10$^9$ |
| 2 | 170 | 39.8 | 0.559 | 0.054 | 266.5 | 4.55 | 2.51 × 10$^9$ |
| 3 | 270 | 12.0 | 0.654 | 0.046 | 491.2 | 6.51 | 3.30 × 10$^8$ |
| 4 | 290 | 23.6 | 0.656 | 0.046 | 563.2 | 7.22 | 4.80 × 10$^8$ |
| 5 | 400 | 45.5 | 0.629 | 0.048 | 1165.4 | 7.95 | 7.05 × 10$^8$ |
| 6 | 480 | 7.8 | 0.623 | 0.049 | 1710.7 | 10.35 | 1.16 × 10$^8$ |
| 7 | 520 | 6.7 | 0.643 | 0.047 | 1884.7 | 8.18 | 9.11 × 10$^7$ |
| 8 | 700 | 16 | 0.682 | 0.044 | 3036.0 | 11.13 | 9.14 × 10$^7$ |
| 9 | 800 | 11.4 | 0.682 | 0.044 | 3965.4 | 12.69 | 6.22 × 10$^7$ |

Determination of the Source Reduced Brightness, $B_r$, of Example Embodiments

The source reduced brightness is defined by the following relationship [18]:

$$B_r = \frac{4I'}{\pi d_v^2 V_0} \quad (14)$$

Where I' is the angular current density, $d_v$ is the virtual source size, and $V_0$ is the extraction voltage. The virtual source size can be calculated using the derived formula [18]:

$$d_v = 1.67 \frac{a}{m_a} \sqrt{\frac{<E_t>}{eV_0}} \quad (15)$$

In this formula, a is the tip radius and $<E_t>$ is defined as $<E_t>$=ehF/√(8mφ), with F the local electric field, φ the work function, and h the reduced Planck constant. Using Equations (14) and (15) gives the following formula for source reduced brightness for cold field emitters [18]:

$$B_r = 1.44 \frac{eI'}{\pi <E_t>} \left(\frac{m_a}{a}\right)^2 \quad (16)$$

Table 3 presents the data of nine cathode-tips according to example embodiments used for the calculation of the reduced brightness that are shown in FIG. 12a.

In one embodiment a cathode structure for cold field electron emission comprises a pointed cathode wire; and a graphene-based coating on at least a tip of the pointed cathode wire.

A radius of the tip may be in the range from about 100 to 800 nm.

The cathode structure may exhibit a low work function value of about 1.1 eV.

The cathode structure may, in one non-limiting example, exhibit a low electric field strength requirement of about 0.5 V/nm. It is noted that the value of the electric field strength requirement can vary, for example depending on a particular radius of the tip of the pointed cathode wire.

The cathode wire may comprise a metal. The metal may be in polycrystalline form. The metal may comprise one or more of a group consisting of Ni, Co, Pd, Al, Cu, and Ag.

The graphene based coating may comprises one or more of a group consisting of graphene, graphene oxide (GO), rGO and their derivatives.

Figure 20:
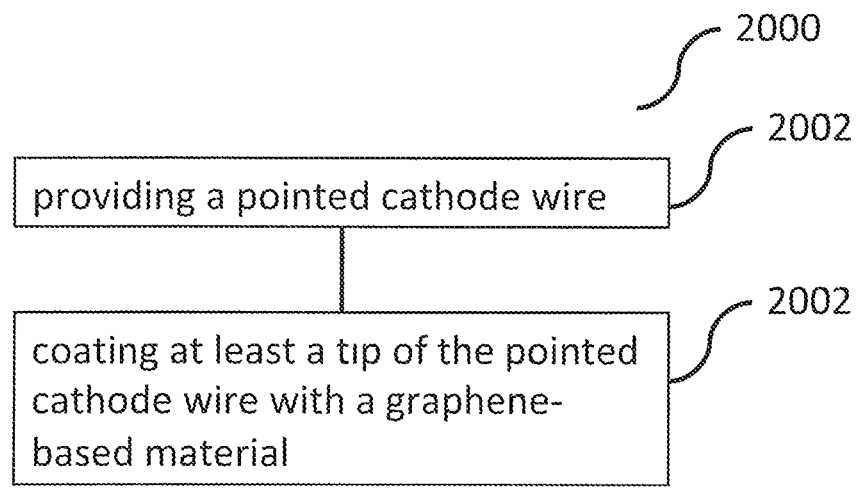
FIG. 20 shows a flow chart illustrating a method of fabricating a cathode structure for cold field electron emission according to an example embodiment.

FIG. 20 shows a flow chart 2000 illustrating a method of fabricating a cathode structure for cold field electron emission according to an example embodiment. At step 2002, a pointed cathode wire is provided. At step 2004, at least a tip of the pointed cathode wire is coated with a graphene-based material.

The coating may be performed by chemical vapor deposition, CVD. A solid carbon source may be used in one example. A liquid/gaseous carbon source can be used in other examples.

The method may comprise heating the tip to about 500 to 950 degree Celsius during the coating. It is noted that the lower limit can vary, for example depending on the decomposition temperature of the carbon source. It is noted that the upper limit can vary, for example depending on the melting effect of the tip of the pointed cathode wire.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The invention claimed is:

1. A cathode structure for cold field electron emission comprising:
   a single cathode emission site comprising a pointed cathode wire terminating in a single tip, the cathode wire comprising a metal in polycrystalline form; and
   a graphene-based coating on at least a tip of the pointed cathode wire.

2. The cathode structure of claim 1, wherein the metal comprises Ni and the cathode structure exhibits a low work function value of about 1.1 eV.

3. The cathode structure of claim 1, wherein the metal comprises one or more of a group consisting of Ni, Co, Pd, Al, Cu, and Ag.

4. The cathode structure of claim 1, wherein the graphene based coating comprises one or more of a group consisting of graphene, graphene oxide (GO), rGO and their derivatives.

5. The cathode structure of claim 1, wherein a radius of the tip is in the range from about 100 to 800 nm.

6. The cathode structure of claim 1, exhibiting a low electric field strength requirement of about 0.5 V/nm.

7. A method of fabricating a cathode structure for cold field electron emission, the method comprising the steps of:
provinding a single cathode emission site comprising a pointed cathode wire terminating in a single tip, the cathode wire comprising a metal in polycrystalline form; and
coating at least a tip of the pointed cathode wire with a graphene-based material.

8. The method of claim 7, wherein the coating is performed by chemical vapor deposition, CVD.

9. The method of claim 8, wherein a solid carbon source is used.

10. The method of claim 8, wherein a liquid/gaseous carbon source is used.

11. The method of claim 7, comprising heating the tip to about 500 to 950 degree Celsius during the coating.

12. The method of claim 7, wherein a radius of the tip is in the range from about 100 to 800 nm.

13. The method of claim 7, wherein the metal comprises Ni and the cathode structure exhibits a low work function value of about 1.1 eV.

14. The method of claim 7, wherein the cathode structure exhibits a low electric field strength requirement of about 0.5 V/nm.

15. The method of claim 7, wherein the metal comprises one or more of a group consisting of Ni, Co, Pd, Al, Cu, and Ag.

16. The method of claim 7, wherein the graphene based coating comprises one or more of a group consisting of graphene, graphene oxide (GO), rGO and their derivatives.

* * * * *